(12) United States Patent
Miyasaka et al.

(10) Patent No.: US 6,573,161 B1
(45) Date of Patent: Jun. 3, 2003

(54) THIN FILM SEMICONDUCTOR DEVICE FABRICATION PROCESS

(75) Inventors: Mitsutoshi Miyasaka, Suwa (JP); Tetsuya Ogawa, Amagasaki (JP); Hidetada Tokioka, Amagasaki (JP); Yukio Satoh, Sanda (JP); Mitsuo Inoue, Osaka (JP); Tomohiro Sasagawa, Suita (JP)

(73) Assignees: Seiko Epson Corporation, Tokyo (JP); Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/674,645

(22) PCT Filed: Jan. 14, 2000

(86) PCT No.: PCT/JP00/00161

§ 371 (c)(1),
(2), (4) Date: Nov. 2, 2000

(87) PCT Pub. No.: WO00/54313

PCT Pub. Date: Sep. 14, 2000

(30) Foreign Application Priority Data

Mar. 5, 1999 (JP) .......................................... 11-058842

(51) Int. Cl.⁷ .......................... H01L 21/20; H01L 21/36
(52) U.S. Cl. ...................... 438/487; 438/486; 438/488
(58) Field of Search ............................. 438/479, 481, 438/482, 484, 485, 486, 487, 488

(56) References Cited

U.S. PATENT DOCUMENTS

| | | | |
|---|---|---|---|
| 4,059,461 A | 11/1977 | Fan et al. ..................... 438/92 |
| 4,319,954 A | 3/1982 | White et al. ................ 438/663 |
| 4,439,245 A | 3/1984 | Wu | |
| 5,346,850 A | 9/1994 | Kaschmitter ................ 438/487 |
| 5,529,951 A | 6/1996 | Noguchi ..................... 438/487 |
| 5,581,102 A | 12/1996 | Kusumoto .................. 257/347 |
| 5,766,989 A | 6/1998 | Maegawa et al. | |
| 5,803,965 A | 9/1998 | Yoon | |
| 5,869,803 A | 2/1999 | Noguchi et al. | |
| 5,932,118 A | 8/1999 | Yamamoto ............. 219/121.66 |
| 6,093,935 A | 7/2000 | Kusumoto .................... 257/52 |
| 6,265,745 B1 | 7/2001 | Kusumoto .................. 257/350 |

FOREIGN PATENT DOCUMENTS

| | | |
|---|---|---|
| JP | 57-5327 (Abstract) | 1/1982 |
| JP | 2224346 | 9/1990 |
| JP | 5-74702 (Abstract) | 3/1993 |
| JP | 6204248 | 7/1994 |
| JP | 7169974 | 7/1995 |

OTHER PUBLICATIONS

Hayashi, "Fabrication of Low–temperature Bottom–Gate Poly–Si TFTs on Large–Area Substrate by Linear–Beam Excimer laser Crystallization and Ion Doping Method", Proceedings of IEEE, p 829–832 (1995).

(List continued on next page.)

*Primary Examiner*—Kamand Cuneo
*Assistant Examiner*—Asok Kumar Sarkar
(74) *Attorney, Agent, or Firm*—Oliff & Berridge, PLC

(57) ABSTRACT

A fabrication process is provided for semiconductor devices having a crystalline semiconductor film formed on a substrate, the semiconductor film being an active layer of a transistor and being mainly composed of silicon, and includes at least an underlevel protection layer fabrication step of forming a silicon oxide film as an underlevel protection layer on the substrate; a first processing step of forming a semiconductor film, which is mainly composed of silicon, on the underlevel protection layer; and a second processing step of irradiating a pulsed laser light on the semiconductor film. The semiconductor film is irradiated by a pulsed laser, the wavelength of the pulsed laser light is between 370 and 710 nm. As a result, using a low temperature process, high performance thin film semiconductor devices can be produced simply and reliably.

36 Claims, 17 Drawing Sheets

Irradiation Profile on the Semiconductor Layer Surface

OTHER PUBLICATIONS

Endert, "Excimer Laser: a new Tool for precision Micromachining", Optical and Quantum Electronics, vol. 27, p. 1319–1335 (1995).

Cellar et al., "Annular grain structures in pulsed laser recrystallized Si on amorphous insulators", Appl. Physics Lett. 39(5), Sep. 1, 1981.

Falster et al., "Grain Enlargement in Polysilicon on Insulating Substrates induced by Q–Switched Nd: Yag Laser Irradiation".

Carvalho et al., "Nd–Yag Laser Induced Crystallization on a–Si:H Thin Films", Materials Research Society, vol. 358, 1995.

EPO Search Report.

I. Ferreira et al.: "Undoped and doped crystalline silicon films obtained by ND–YAG Laser" Thin Solid Films, Ch. Elsevier–Sequioa S.A. Lausanne, vol. 317, No. ½, Apr. 1, 1998, pp. 140–143, XP0000667818 ISSN: 0040–6090, Abstract.

S.D. Brotherton et al.: "Influence of Melt Depth in Laser Crystallized Poly–Si Thin Film Transistors" Journal of Applied Physics, US, American Institute of Physics, New York; vol. 82, No. 8, Oct. 15, 1997, pp. 4086–4094, XP000738000 ISSN: 0021–8979, p. 4086.

Crystallization in the Prior Art
After Laser Irradiation

Crystallization in the Prior Art
During Laser Irradiation

Crystallization in the Present Invention During Laser Irradiation

Crystallization in the Present Invention After Laser Irradiation

Irradiation Profile
on the Semiconductor Layer Surface

Laser Intensity Distribution
Corresponding to Section A-A' in Figure Above

Irradiation Profile
on the Semiconductor Layer Surface

Laser Intensity Distribution
Corresponding to Section A-A' in Figure Above

Trapezoidal Laser Intensity Distribution along Section B-B' of Figure 7A

Gaussian Laser Intensity Distribution along Section B-B' of Figure 7A

Fig.16

| Laser Energy Density $(mJ \cdot cm^{-2})$ | Maximum Energy Density Gradient $(mJ \cdot cm^{-2} \cdot \mu m^{-1})$ | Average n-type TFT Mobility $(cm^2 \cdot V^{-1} \cdot s^{-1})$ |
|---|---|---|
| 300 | 11.25 | 6 |
| 400 | 15.00 | 19 |
| 500 | 18.75 | 51 |
| 600 | 22.50 | 171 |
| 700 | 26.25 | 186 |
| 800 | 30.00 | 192 |
| 900 | 33.75 | 188 |

THIN FILM SEMICONDUCTOR DEVICE FABRICATION PROCESS

BACKGROUND OF THE INVENTION

1. Field of the Invention

The present invention relates to the fabrication process of thin film semiconductor devices suitable for active matrix liquid crystal display devices, and the like.

2. Description of the Related Art

Previously, a fabrication process such as that described below has been adopted for the low temperature production of polycrystalline silicon thin film transistors (p-Si TFT), representative of thin film semiconductor devices, at temperatures of 600° C. or below at which conventional glass substrates can be used, or for the low temperature production of amorphous silicon thin film transistors (a-Si TFT) in a similar temperature range of 425° C. or less. First, an amorphous silicon layer which will serve as the semiconductor film is deposited on a substrate to a thickness of approximately 50 nm by low pressure chemical vapor deposition (LPCVD). Next, the amorphous silicon layer is irradiated by a XeCl excimer laser (wavelength of 308 nm) to produce a polycrystalline silicon layer (p-Si layer). Because the absorption coefficients for the XeCl laser light for amorphous silicon and polycrystalline silicon are large at 0.139 nm$^{-1}$ and 0.149 nm$^{-1}$ respectively, 90% of the laser light incident upon the semiconductor film is absorbed within the first 15 nm. Additionally, the absorption coefficient for amorphous silicon is 7% less than the absorption coefficient for polycrystalline silicon. Following the laser irradiation step, a silicon oxide layer which serves as the gate insulator layer is deposited by either chemical vapor deposition (CVD) or physical vapor deposition (PVD). Next, a gate electrode of tantalum or other material is formed to create a metal (gate electrode)-oxide (gate insulator layer)-semiconductor (polycrystalline silicon layer) field effect transistor (MOS-FET) structure. Finally, an interlevel dielectric layer is deposited on top of these layers; and following the opening of contact holes, interconnects are created from metal films, and the thin film semiconductor device is complete.

SUMMARY OF THE INVENTION

During this fabrication procedure for thin film semiconductor devices, however, it is difficult to control the energy density of the excimer laser; and even a slight variation in energy density can lead to a large degree of variation in the quality of the semiconductor film within the same substrate. Further, if the energy density is even slightly more than a threshold value determined by such factors as the film thickness and hydrogen content of the film, considerable damage can be inflicted on the semiconductor film and lead to significant degradation in the semiconductor characteristics and production yield. As a result of these factors, it is necessary to set the laser energy density considerably less than the optimal value in order to obtain a uniform polycrystalline semiconductor film over the entire substrate; and the energy density is insufficient to produce good quality polycrystalline thin films. Additionally, even if the optimal energy density is used for irradiation, it is difficult to increase the size of the grains comprising the polycrystalline film; and it is known that many defects remain within the film. Consequently, it is not possible to reliably produce thin film semiconductor devices such as p-Si TFTs using the technology of the prior art without sacrificing the electrical characteristics of the completed thin film semiconductor devices.

Therefore, in consideration of the all the issues described above, the objective of the present invention is to provide a fabrication procedure to reliably produce superior thin film semiconductor devices with a low temperature process which is 600° C. or less, and ideally 425° C. or less.

OUTLINE OF THE INVENTION

The present invention is a fabrication process of a thin film semiconductor device having a crystalline semiconductor film formed on a substrate, said semiconductor film being an active layer of a transistor and being mainly composed of silicon (Si), the process comprising: an underlevel protection layer formation step of forming a silicon oxide film as an underlevel protection layer on the substrate; a first processing step of forming a semiconductor film, which is mainly composed of silicon (Si), on the underlevel protection layer; and a second processing step of irradiating a pulsed laser light on the semiconductor film, wherein the absorption coefficient of said pulsed laser light is larger in amorphous silicon than in polycrystalline silicon.

The present invention is further characterized by the fact that the absorption coefficient of the pulsed laser light in polycrystalline silicon $m_{pSsi}$ is $10^{-3}$ nm$^{-1}$ or higher and $10^{-2}$ nm$^{-1}$ or lower. In this case, if the film thickness of the semiconductor film is taken to be d, it is desirable for the film thickness d and the previously described absorption coefficient $m_{pSi}$ to satisfy the following relationship $$0.105 \cdot m_{pSi}^{-1} < d < 0.693 \cdot m_{pSi}^{-1}.$$

Ideally, the following relationship is satisfied $$0.405 \cdot m_{pSi}^{-1} < d < 0.693 \cdot m_{pSi}^{-1}.$$

In order for the present invention to be applicable to liquid crystal display devices, it is desirable for the substrate to be transparent to visible light. Further, regardless of the application, its also desirable for the substrate to be essentially transparent to the pulsed laser light. "Essentially transparent" means that the absorption coefficient of the pulsed laser light in the substrate is at least one tenth the absorption coefficient in polycrystalline silicon or lower. Specifically, the absorption coefficient of the substrate $m_{Sub}$ should be approximately $10^{-4}$ nm$^{-1}$ or lower. Normally, formation of the semiconductor film mentioned above would include a deposition step by chemical vapor deposition (CVD). Within the chemical vapor deposition process category, low pressure chemical vapor deposition (LPCVD) is particularly applicable; and it can be said further that semiconductor film deposition in a high vacuum low pressure chemical vapor deposition chamber is ideal. A high vacuum low pressure chemical vapor deposition chamber is one in which the background pressure just prior to semiconductor film deposition is typically $5 \times 10^{-7}$ Torr or less. It is desirable for the pulsed laser light to be produced by a solid state light emitting element, and a pulsed laser light produced by the second harmonic of a pulsed Nd: YAG laser (abbreviated as YAG 2w) is the best. When a YAG 2w laser light impinges on a semiconductor film comprised mainly of silicon, it is preferable for the thickness of the semiconductor film to be approximately 25 nm or more and approximately 165 nm or less and, ideally, to be approximately 25 nm or more and approximately 95 nm or less.

During laser irradiation in the second process step, the pulsed laser light irradiation region on top of the semiconductor film has a width W (mm) and a length L (mm) and ranges from a line profile to an approximately rectangular profile. Within the irradiation region, the pulsed laser's irradiation energy density has a roughly trapezoidal distribution along the length of the region. On the other hand, along the width of the region, it is preferable to have a irradiation energy distribution which is either trapezoidal or Gaussian. It is desirable for the ratio (L/W) of the irradiation region length, L, to the width, W, to be greater than or equal to 100, and ideally greater than or equal to 1000. It is preferable for the maximum gradient of the irradiation energy density along the width of the profile to have a value of 3 mJ·cm$^{-2}$·mm$^{-1}$ or higher. The entire substrate is laser irradiated by translating the irradiation region having the features described above along the width of the profile after each irradiation. A second process step in which a given point on the semiconductor film is covered by more than approximately 10 and less than approximately 80 pulsed laser irradiations during this process is desirable.

BRIEF DESCRIPTION OF THE DRAWINGS

FIG. 3 explains the principle of an exemplary embodiment of the present invention;

FIGS. 10–16 show exemplary effects of various exemplary embodiments of the present invention.

DETAILED DESCRIPTION OF THE EMBODIMENTS

Figure 1:
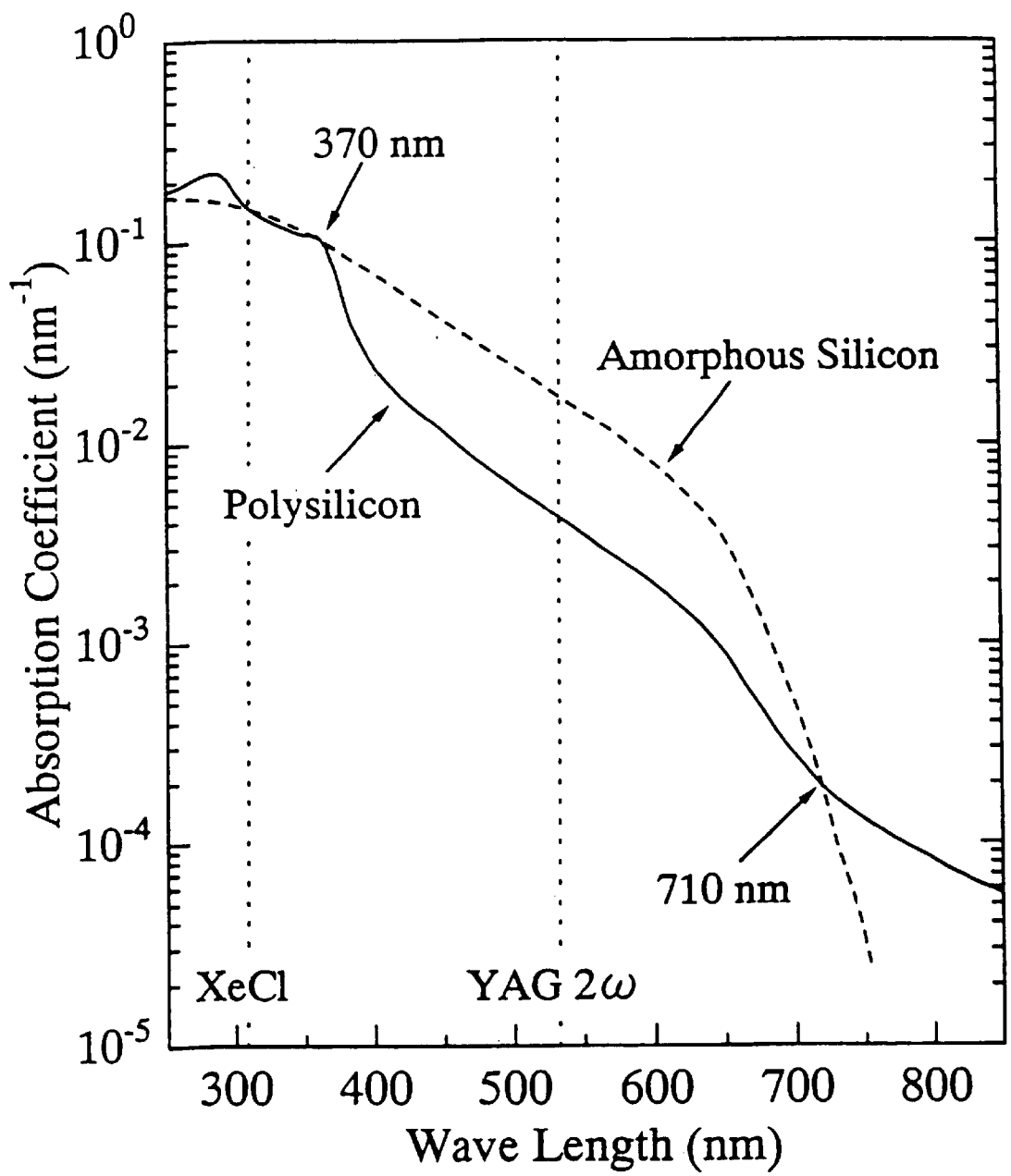
FIG. 1 shows an exemplary relationship between the wavelength of light and the absorption coefficient of the semiconductor.

The present invention concerns the fabrication procedure for thin film semiconductor devices which employ as the active layer a crystalline semiconductor film formed on a transparent substrate which could be either a low heat-resistant glass substrate with a strain point temperature between about 550° C. and 650° C. or a high heat-resistant plastic substrate. The fabrication procedure includes an underlevel protection layer fabrication step in which an underlevel protection layer comprised of silicon oxide is formed on the substrate; a first processing step in which a semiconductor film comprised mainly of silicon (Si) is formed on top of the underlevel protection layer; and a second processing step in which the semiconductor film is irradiated by a pulsed laser.

In order for the present invention to be applicable to liquid crystal display devices, it is desirable for the substrate to be transparent to visible light; and, further, for other applications as well, its also desirable for the substrate to be essentially transparent to at least the pulsed laser light. Specifically, the absorption coefficient of the pulsed laser light in the substrate should be at least one tenth or less of the absorption coefficient in silicon. Because the present invention employs technology which strictly regulates the degree of transmission of the pulsed laser light in the semiconductor film, damage to the substrate is inflicted by the pulsed laser light if the absorption coefficient of the pulsed laser light in the substrate is not sufficiently less than the absorption coefficient of the pulsed laser light in the semiconductor film. As will be explained later, it is necessary to optimize such factors as the laser light intensity and wavelength and the semiconductor film thickness in order to obtain high quality crystalline semiconductor films; and it is consequently necessary to have the substrate essentially transparent with respect to the pulsed laser light. In actuality, if the absorption coefficient of the pulsed laser light in the substrate is equal to or less than approximately one tenth the absorption coefficient of the pulsed laser light in the semiconductor film, the thickness of the layer in the substrate over which the laser light is absorbed is approximately ten times greater than the thickness of the layer in the semiconductor film. Thus, because the volume in which the laser light is absorbed in the substrate increases as does the heat capacity correspondingly, it becomes possible to relatively suppress the temperature rise within the substrate. In other words, in order to avoid damage to both the substrate and thin film semiconductor devices and thereby produce good quality thin film semiconductor devices, it is essential for the substrate to meet the optical characteristic conditions described above.

In the second processing step, the wavelength 1 of the pulsed laser light is between 370 nm and 710 nm. For light in this wavelength range, the absorption coefficient in amorphous silicon is greater than the absorption coefficient in polycrystalline silicon. Further, even within this range, it is desirable for the absorption coefficient of polycrystalline silicon $m_{pSi}$ to be between $10^{-3}$ nm$^{-1}$ and $10^{-2}$ nm$^{-1}$. It is necessary for the irradiation energy density of the pulsed laser light on the semiconductor film to be sufficiently intense to melt at least a portion of the semiconductor film.

In the first processing step, a semiconductor film comprised mainly of silicon (Si) is formed on top of the underlevel protection layer. As the semiconductor film, a semiconducting material such as exemplified by silicon (Si) or silicon germanium ($Si_xGe_{1-x}$: 0<x<1) is used; and silicon is the major atomic constituent (silicon atom fraction of 80% or higher). For the substrates, it is conventional to use the transparent non-alkali glass used for liquid crystal displays or insulating substrates such as plastics or ceramics, although they are not restricted to these types as long as the heat resistance of the substrate (the strain point temperature in the case of glass substrates) is equal to or greater than approximately 550° C. Approximately 100 nm to 10 mm of silicon oxide is deposited on the surface of these substrates to act as an underlevel protection layer with respect to the semiconductor film. The silicon oxide underlevel protection layer does not act solely to electrically isolate the semiconductor film and the substrate or to prevent the diffusion of impurities from the substrate into the semiconductor film, but also creates a good interface between the underlevel oxide layer and the crystalline semiconductor film. In the present invention, the semiconductor film in the thin film semiconductor devices has a thickness of between roughly 10 nm and 200 nm and corresponds to the case in which the energy band bends across the entire thickness of the semiconductor film (corresponding to a total depletion SOI model). Under these conditions, contributions to electrical conduction can come from both the gate insulator and semiconductor film interface, and the underlevel protection layer and semiconductor film interface. Because silicon oxide is the material which can best decrease interface trapping states when it forms an interface with the semiconductor film, it is appropriate for the underlevel protection layer. The semiconductor film is formed on top of this underlevel protection layer. Therefore, the use of a silicon oxide layer which can form an interface with the semiconductor film which has in the order of $10^{12}$ cm$^{-2}$ or fewer interface states is desirable as the underlevel protection layer in the present invention. Further, with the present invention, because there is a strong tendency for the bottom portion of the semiconductor film to also be heated to a high temperature in comparison to the technology of the prior art, the diffusion of impurities from the substrate can occur easily. Therefore, to avoid this and produce high quality thin film semiconductor devices using high purity semiconductor films in the present invention, it is essential to use highly dense silicon oxide films as the underlevel protection layer. Silicon oxide films of this type have an etching rate of 1.5 nm/sec or less in a 1.6±0.2% aqueous solution of hydrofluoric acid (HF) held at 25±5° C. Normally, the underlevel protection layer is formed by a vapor deposition method such as plasma-enhanced chemical vapor deposition (PECVD), low pressure chemical vapor deposition (LPCVD), or sputtering. Among these, as a means which is particularly applicable in the present invention for depositing the underlevel protection layer, it is desirable to use a type of PECVD such as electron cyclotron resonance PECVD (ECR-PECVD), helicon PECVD, or remote PECVD. Further, in order to obtain a silicon oxide film appropriate for the present invention through the use of conventional PECVD at either the industrial frequency (13.56 MHz) or an integer multiple of this frequency, TEOS (Si—(O—CH$_2$CH$_3$)$_4$) and oxygen (O$_2$) should be used as source materials with the oxygen flow rate set to be at least five times the TEOS flow rate to deposit the silicon oxide films. Alternatively, the silicon oxide can be deposited using a mixture of monosilane (SiH$_4$) and nitrous oxide (N$_2$O) as source materials, and a noble gas such as either helium (He) or argon (Ar) as a dilution gas; and the noble gas flow rate should be greater than about 90% of the total gas flow rate (in other words, the flow rate of the source gases should be less than about 10% of the total gas flow rate). The substrate temperature should be 280° C. or higher during this procedure. When high purity quartz is used for the substrate, it may be used as both the underlevel protection layer and the substrate; but formation of the underlevel protection layer using the method described above is preferable in order to minimize variation in the semiconductor film quality by having a fixed surface condition.

The semiconductor film, which is either amorphous or crystalline, is deposited on top of the underlevel protection layer by chemical vapor deposition (CVD) preferably using a higher order silane (Si$_n$H$_{2n+2}$: n=2, 3, 4) as one of the source gases. Although various types of vapor phase deposition methods such as plasma-enhanced chemical vapor deposition (PECVD), low pressure chemical vapor deposition (LPCVD), atmospheric pressure chemical vapor deposition (APCVD), or sputtering may be used to deposit the semiconductor film, among these, low pressure chemical vapor deposition (LPCVD) is particularly appropriate for allowing easy deposition of high purity semiconductor films. Low pressure chemical vapor deposition occurs in a high vacuum low pressure chemical vapor deposition reactor. This is because increasing the purity of the semiconductor film minimizes the generation of crystal nuclei which result from impurities and allows the present invention to ultimately obtain high purity crystalline semiconductor films which have large grain size. Particularly in this invention, because the semiconductor film is relatively uniformly heated through the entire thickness and grain growth is forced to proceed laterally in the second processing step, large-grain polycrystalline semiconductor films can be easily obtained if the generation of crystal nuclei from impurities can be minimized. The high vacuum reactor can achieve a background pressure of $5\times10^{-7}$ Torr or less in the deposition chamber just prior to deposition of the semiconductor film. It is desirable for this type of high vacuum low pressure chemical vapor deposition reactor to not only have a superior airtightness in the deposition chamber, but also to have an exhaust capability which allows an exhaust rate of approximately 100 sccm/mTorr (an exhaust rate which can obtain an equilibrium pressure of 1 mTorr when 100 sccm of a non-reactive gas is flowing into the deposition chamber) or more from the deposition chamber. A reactor with such a high exhaust capability can, in the relatively brief span of about an hour, sufficiently decrease the outgassing rate of the substrates to maintain high throughput, and allow deposition of high purity semiconductor films.

It is desirable for the deposition of the semiconductor film, which is mainly silicon as exemplified by an amorphous silicon layer, to be done using a higher order silane (Si$_n$H$_{2n+2}$: n is an integer=2) as one of the source gases. From the consideration of factors such as cost and safety, disilane (Si$_2$H$_6$) is the most appropriate higher order silane. Using disilane with low pressure chemical vapor deposition, it is possible to deposit high purity amorphous silicon films at a relatively high rate of 0.5 nm/min or higher at the low temperature of 425° C. or less. In order to obtain high quality amorphous semiconductor films appropriate for the present invention, the control of the deposition temperature and the deposition rate is important. Determination of the disilane flow rate and pressure during deposition is necessary to achieve deposition at a temperature of 430° C. or less and a deposition rate of 0.6 nm/min or higher.

It is difficult to use LPCVD when large-sized substrates having an area of 2000 cm$^2$ or greater are used. Under these conditions, the semiconductor films are deposited in a plasma box type of PECVD reactor. With a plasma box type of PECVD reactor, because the deposition chamber in which the plasma processing occurs is located within another larger vacuum chamber, it is possible to obtain a background pressure of $1\times10^{-6}$ Torr or lower in the deposition chamber. Although the background pressure is worse than that of a high vacuum LPCVD reactor, because a deposition rate of 3 nm/min or higher can be obtained for the semiconductor film, the result is that high purity semiconductor films in which the generation of crystal nuclei by impurities is minimized can be obtained. In applying PECVD to the present invention, the semiconductor film is deposited under conditions in which the background pressure in the deposition chamber is in the order of $1\times10^{-6}$ Torr or less and the deposition rate of the semiconductor film is approximately 3 nm/min or higher. The substrate temperature during deposition of the amorphous film is between approximately 250° C. and 450° C. When the temperature is greater than approximately 250° C., the hydrogen content in the amorphous films can be decreased to about 8% or lower; and it becomes possible to reliably crystallize the films in the second processing step. When the temperature is below approximately 450° C., the amorphous regions comprising the amorphous film become larger; and it is possible for the crystalline grains which comprise the polycrystalline film following crystallization of the amorphous film to also become large. The ideal temperature is in the range of 300° C. to 400° C. For laser crystallization in the second processing step to proceed in a stable manner, the hydrogen content of the amorphous semiconductor films should be less than about 5 atomic percent with respect to silicon. It is possible to produce such low hydrogen content silicon films by using a deposition rate of 25 nm/min or lower. Using PECVD, it is also acceptable to use monosilane rather than disilane as a source gas.

Following production of an amorphous semiconductor film or polycrystalline semiconductor film in the manner described above, in the second processing step, the semiconductor film is irradiated by a pulsed laser light to effect crystallization of an amorphous film or to effect recrystallization of a polycrystalline semiconductor film. Although a continuous wave laser can also be used, the use of a pulsed laser light is preferable. The reason for this is that the present invention effects lateral grain growth as will be explained later, and it is certainly easier to produce a large grain size polycrystalline semiconductor thin film using a pulsed laser light which can be translated an appropriate distance after each laser shot than it is with a continuous wave laser. A pulsed laser having a wavelength 1 between 370 nm and 710 nm is used for laser irradiation of the semiconductor film. The absorption coefficient for such a laser light in both amorphous silicon and polycrystalline silicon is shown in FIG. 1. The horizontal axis in FIG. 1 is light wavelength, and the vertical axis is the absorption coefficient. The dashed line labeled Amorphous Silicon represents amorphous silicon, and the solid line labeled Polysilicon represents polysilicon. As can be seen from FIG. 1, the absorption coefficient in amorphous silicon exceeds the absorption coefficient in polycrystalline silicon in the wavelength range between 370 nm and 710 nm. In other words, the semiconductor film is irradiated with a pulsed laser light in which the absorption coefficient in amorphous silicon exceeds the absorption coefficient in polycrystalline silicon. For example, the absorption coefficient of amorphous silicon $m_{aSi}$ and the absorption coefficient of polycrystalline silicon $m_{pSi}$ are $$m_{aSi}(YAG\ 2w) = 0.01723\ nm^{-1}$$

and $$m_{pSi}(YAG\ 2w) = 0.00426\ nm^{-1},$$

respectively, at a wavelength of approximately 532 nm which corresponds to the second harmonic of an Nd-doped YAG laser (abbreviated as YAG 2w). The absorption coefficient in amorphous silicon is more than four times the absorption coefficient in polycrystalline silicon. The polycrystalline film is composed microscopically of crystalline and non-crystalline components. The crystalline components have an extremely small number of defects such as stacking faults within the grains and can be said to be essentially single crystal in nature. On the other hand, the non-crystalline components can be seen to contain regions with structural disorder such as in the grain boundaries and within grains and can be said to be so-called amorphous in nature. In melt crystallization in which crystallization occurs through laser light irradiation, the unmelted regions become grain growth nuclei during the cooling solidification process. If crystalline components with a high degree of structural order act as grain growth nuclei, grains which grow from these regions also exhibit a high degree of structural order and result in a high quality crystalline film. In contrast, if regions with structural disorder act as grain growth nuclei, defects such as stacking faults originate from these locations during the cooling solidification process; and the films which are ultimately obtained are low quality with defects. Consequently, in order to produce high quality crystalline films, the crystalline components within the polycrystalline films should act as grain growth nuclei without melting; and the amorphous regions should be melted preferentially. In the present invention, because the absorption coefficient of the laser light in amorphous silicon is larger than the absorption coefficient of the laser light in polycrystalline silicon, the amorphous components are heated preferentially with respect to the crystalline components. Specifically, because grain boundaries and defects melt easily, the high quality crystalline components which are essentially single crystalline act as grain growth nuclei; and defects and dangling bonds are significantly reduced and coincidence grain boundaries having a high degree of structural order predominate. From the perspective of the electrical characteristics of the semiconductor films, the phenomenon described above leads to a significant decrease in the density of trap states which appear near the middle of the band gap in the energy band diagram. Additionally, if semiconductor films such as those described above are used for the active layer (source and drain regions as well as the channel region) in thin film semiconductor devices, transistors with low off-currents, steep subthreshold characteristics (small subthreshold swing), and low threshold voltages result. One reason that it was difficult to produce such excellent thin film semiconductor devices using the technology of the prior art was that a laser having a wavelength appropriate for melt crystallization was not used, and both crystalline and amorphous components were melted. The principle of the present invention described above is most effective when the ratio of the absorption coefficient in polycrystalline silicon to the absorption coefficient in amorphous silicon ($m_{pSi}/m_{aSi}$) is small. From FIG. 1, it can be seen that this ratio is large in the wavelength range between approximately 450 nm and 650 nm. Therefore, it can be said that the most desirable wavelength for the pulsed laser light used for irradiation in the second processing step in the present invention is between approximately 450 nm and 650 nm. The absorption coefficient in polycrystalline silicon $m_{pSi}$ for light having a wavelength of 450 nm is $1.127 \times 10^{-2}$ nm$^{-1}$, and the absorption coefficient in polycrystalline silicon for light having a wavelength of 650 nm is $8.9 \times 10^{-4}$ nm$^{-1}$. Therefore, for the second processing step using pulsed laser irradiation with a wavelength between approximately 450 nm and 650 nm, a pulsed laser light having an absorption coefficient in polycrystalline silicon $m_{pSi}$ of between roughly $10^{-3}$ nm$^{-1}$ and $10^{-2}$ nm$^{-1}$ is used.

Because the pulse stability of the laser light is the most important factor in order to obtain high quality polycrystalline semiconductor films, a laser light produced by a solid-state light emitting element is preferred. (This is abbreviated as solid-state laser in this disclosure.) With the excimer gas laser of the prior art, the variation in pulse intensity was about 5% resulting from nonuniformity of the xenon (Xe) and chlorine (Cl) gases in the laser resonator cavity, deterioration of the gases themselves, halogen erosion of the resonator cavity, or the like. Additionally, variation in the lasing angle was also in the order of 5%. Because the variation in the lasing angle caused variation in the area of the irradiation region, the result was that the energy density (energy per unit area) on the surface of the semiconductor film varied by a total of as much as 10% or more and became one factor that impeded the fabrication of superior thin film semiconductor devices. Further, the long term stability of the laser resonance was lacking and led to among-lot variation of the thin film semiconductor devices. In contrast, these types of problems do not exist with solid-state lasers. As a result, the laser resonance is extremely stable; allowing variation in the energy density on the semiconductor film (the ratio of the standard deviation to the mean) to be less than about 5%. In order to more effectively apply the present invention practically, the use of a solid-state laser which can maintain the variation in laser energy density of the surface of the semiconductor film at less than 5% as described above is required. Additionally, the use of a solid-state laser leads to such effects as the minimization of among-lot variation during the production of thin film semiconductor devices and improvements in thin film semiconductor device production throughput, as well as cost decreases by alleviating the burdensome task of frequently exchanging gas supplies which existed previously. A solution which can simultaneously meet the previously described demands for wavelength and absorption coefficient as well as the demand for solid-state is the second harmonic (YAG 2w, wavelength of 532 nm) of the neodymium-doped yttria-alumina-garnet (Nd: YAG) laser in which neodymium (Nd) has been added to the compound oxide of yttrium oxide ($Y_2O_3$) and aluminum oxide ($Al_2O_3$). Consequently, in the second processing step of the present invention, the most appropriate irradiation of the semiconductor film is by the YAG 2w which keeps the energy density variation on the surface of the semiconductor film to less than about 5%.

Light is absorbed within the semiconductor film, and the intensity of the incident light is exponentially attenuated. Now if the intensity of the incident light is $I_{(0)}$, x (nm) is the distance from the surface of the polycrystalline semiconductor film comprised mainly of silicon to a point within the film and the intensity of the light at this point x is $I_{(x)}$, using the absorption coefficient $m_{pSi}$, the following relationship applies, $$I_{(x)}/I_{(0)} = \exp(-m_{pSi} \cdot x) \quad \text{(Equation 1)}.$$

Figure 2:
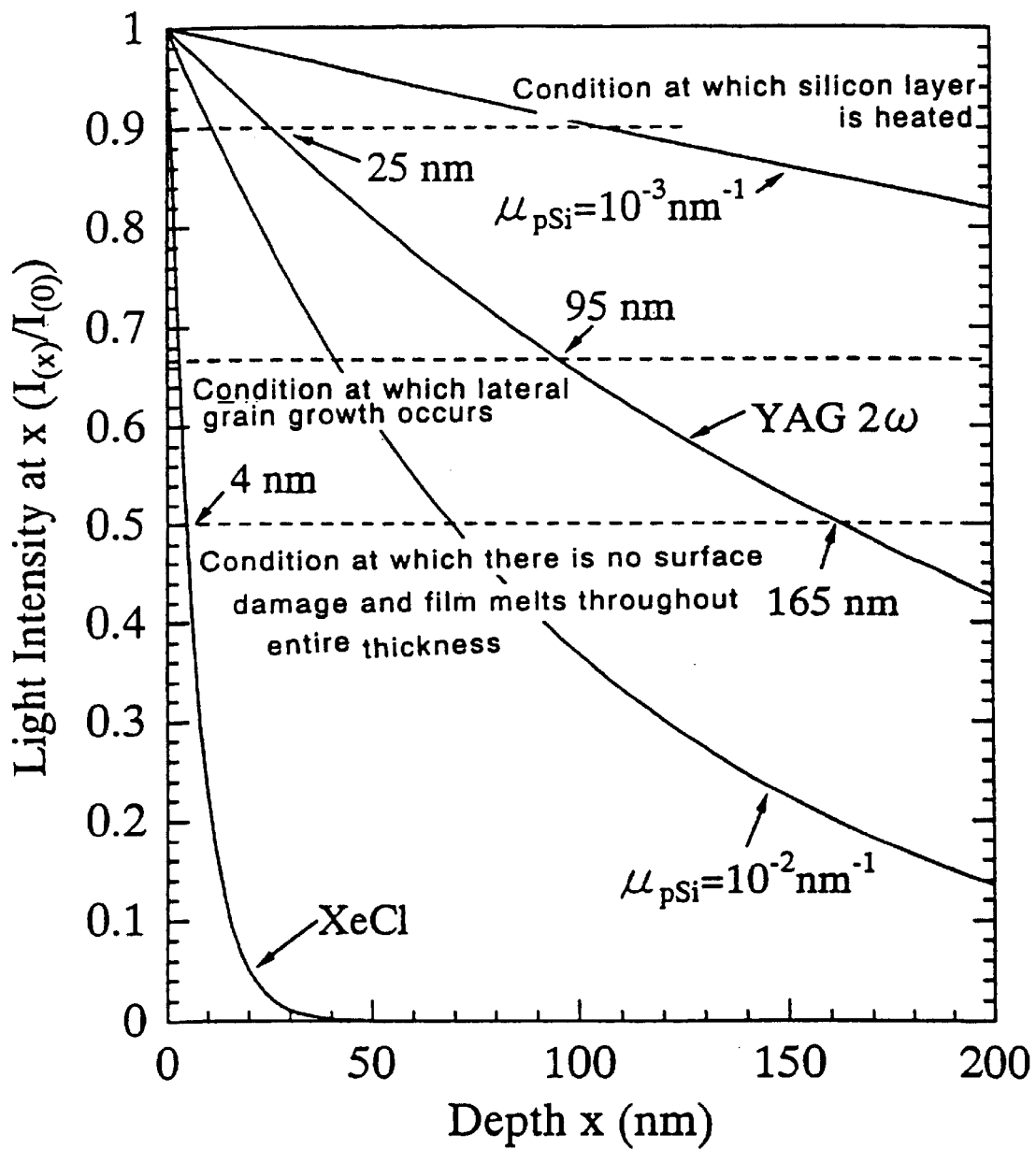
FIG. 2 shows an exemplary relationship between the semiconductor thickness and the intensity of light within the film.

The relationship in Equation 1 is shown in FIG. 2 for the case of $m_{pSi}$ equal to $10^{-3}$ nm$^{-1}$, the case of $m_{pSi}$ equal to $10^{-2}$ nm$^{-1}$, the second harmonic of the Nd: YAG laser most appropriate as the pulsed laser light source for the present invention (YAG 2w), and the XeCl excimer laser of the technology of the prior art. Since it is necessary for at least 10% of the incident light to be absorbed by the semiconductor film in order to have efficient heating of the silicon film, a horizontal dashed line has been drawn in FIG. 2 at the 0.9 location which corresponds to this condition. Further, the light intensity means the amount of heat which can be provided to the silicon, and therefore, FIG. 2 shows the temperature profile within the silicon film during irradiation by the laser light. According to the research of the inventor and others, the reason that the surface of the semiconductor film was heavily damaged by the excimer laser of the prior art while the underlying portion remained a low quality semiconductor film and thus prevented the attainment of high quality polycrystalline semiconductor films was the existence of a large temperature differential between the surface and underlying regions. Elimination of surface damage and the simultaneous relatively uniform melting of the semiconductor film through essentially the entire thickness results when the intensity of the light in the underlying regions of the semiconductor film is about half or more of the incident light intensity. When this condition is met, the temperature differential between the surface and underlying regions is minimized. Another horizontal dashed line corresponding to the position at which the light intensity is half of that at the surface has been drawn at 0.5 in FIG. 2. Therefore, the conditions under which the semiconductor film comprised mainly of silicon can be effectively heated and good crystallization can proceed throughout the entire film thickness while avoiding inflicting damage to the semiconductor film is contained in the region within the two dashed lines at 0.9 and 0.5 in FIG. 2. It can be seen that because almost all of the incident light of the excimer laser of the technology of the prior art is absorbed at the surface of the semiconductor film, the semiconductor film thickness which can be effectively laser crystallized is limited to 1 nm to 4 nm. In contrast, with the conditions of the present invention effective crystallization can be performed over a wide range of film thickness.

Figures 2, 3A:
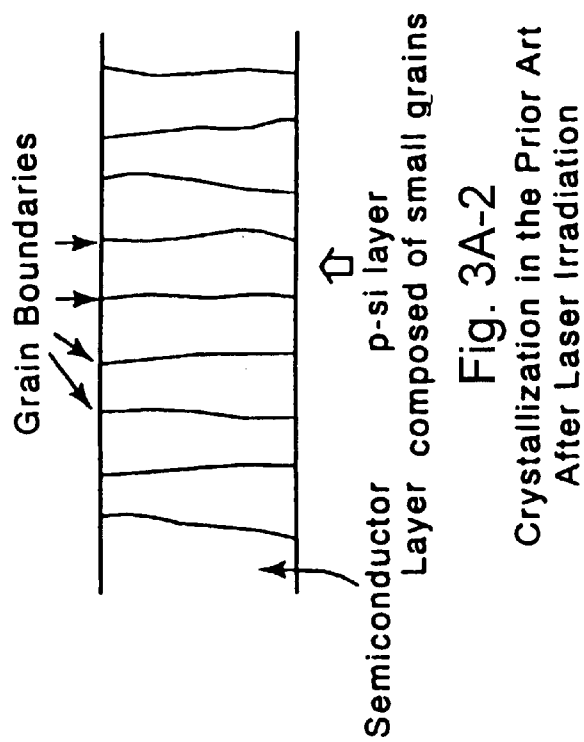
Figures 1, 3A:
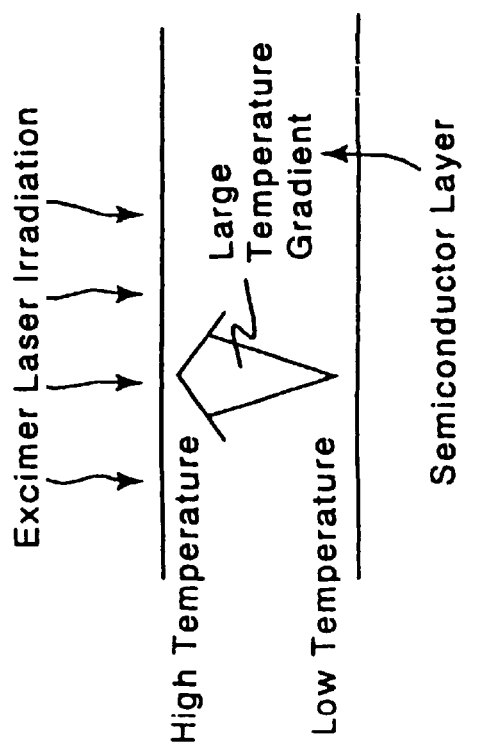
Figures 1, 3B:
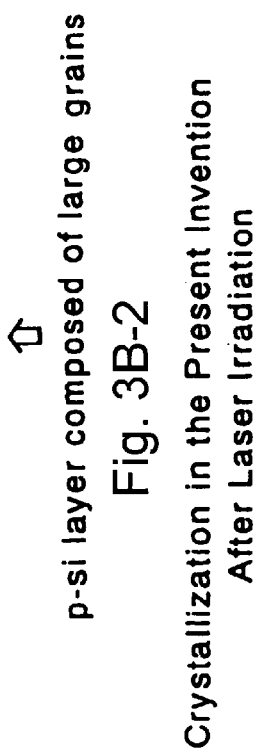
Figures 2, 3B:
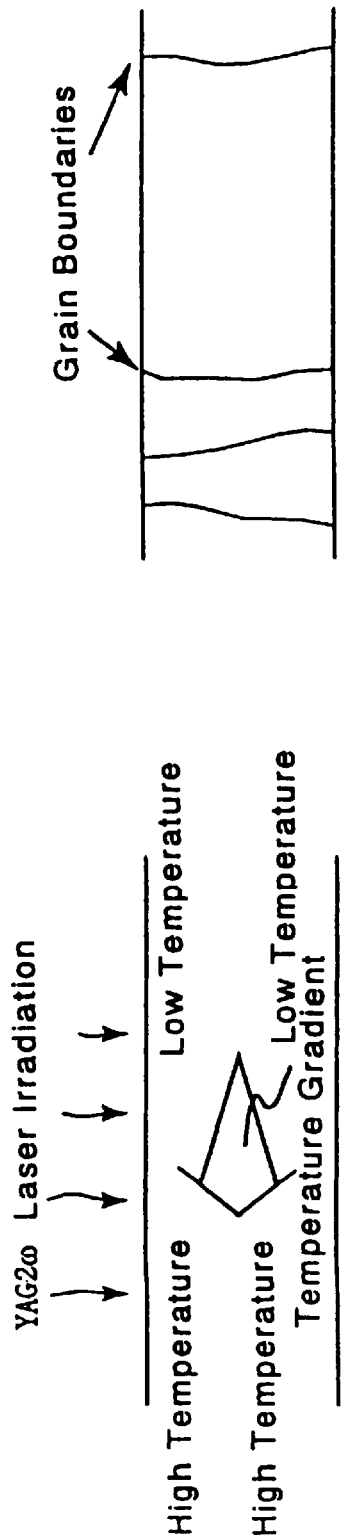

In melt crystallization using a laser, grains will grow along a temperature gradient regardless of the type of laser light used. On the other hand, the thickness of semiconductor films used for thin film semiconductor devices is normally between about 30 nm and 100 nm. As was described earlier, in the XeCl excimer laser irradiation crystallization which was used previously, a steep temperature gradient is generated in the vertical direction within the semiconductor film because almost all of the energy is absorbed within 4 nm or so from the surface of the semiconductor film and only the surface region is heated (FIG. 3a-1). As a result, grains grow from the bottom of the semiconductor film toward the top, and there is a strong tendency for the polycrystalline film which is obtained after laser irradiation to be composed of small grains (FIG. 3a-2). (Because many small grains grow from the bottom toward the top in this fashion using the technology of the prior art, the existence of crystal nuclei resulting from impurities within the semiconductor film were not that big of a problem.) In contrast, with the present invention, because laser irradiation is performed using laser light having the most appropriate absorption coefficient for melt crystallization, the semiconductor film is uniformly heated in the vertical direction throughout the thickness of the film. As a result, a lateral temperature gradient is generated at the edge of the laser irradiated region (FIG. 3b-1), and growth in the lateral direction is easier than growth in the vertical direction. That is, large grains grow at the edge of the irradiated region (FIG. 3b-2). Because the vertical temperature differential is small also at locations within the irradiated region away from the edge, the probability of generating crystal nuclei at the bottom of the semiconductor film is significantly reduced over that previously; and the grains comprising the polycrystalline semiconductor are also larger in general than those previously. Lateral grain growth proceeds when the laser intensity at the surface and at the bottom of the film are not that different; and according to experiments, this occurs when the intensity at the bottom of the semiconductor film is one third or higher than the intensity of the incident beam. A dashed line is drawn in FIG. 2 at the position of 0.667 to mark the condition at which lateral grain growth can be easily generated. Therefore, the conditions under which the semiconductor film comprised mainly of silicon can be effectively heated and lateral grain growth can initiate and form large grain size polycrystalline semiconductor films is contained in the region within the two dashed lines at 0.9 and 0.667 in FIG. 2. Of course, in order to have the growth of large grains, in addition to the temperature gradient discussed above, it is also necessary to suppress crystal nuclei originating from impurities; and it is thus necessary to consider factors such as the underlevel protection layer and the formation of the semiconductor film in the first processing step as described earlier.

Looking at FIG. 2, it can be seen that even if the absorption coefficient is between approximately $10^{-3}$ nm$^{-1}$ and $10^{-2}$ nm$^{-1}$, it is not possible to obtain superior polycrystalline films for all semiconductor film thicknesses. For example, for the YAG 2w (absorption coefficient $m_{pSi}$=4.26× $10^{-3}$ nm$^{-1}$), the silicon film can be effectively heated when the thickness of the semiconductor film is about 25 nm or greater; and the entire film thickness can be essentially uniformly heated without damage to the surface when the thickness of the semiconductor film is about 165 nm or less. Further, the initiation of lateral grain growth and the growth of large grains occurs when the thickness of the semiconductor film is about 95 nm or less. Consequently, the desirable film thickness for the irradiation of the semiconductor film comprised mainly of silicon with the YAG 2w laser light is between approximately 25 nm and 165 nm; and ideally the thickness should be between approximately 25 nm and 95 nm. In this manner, the optimum semiconductor film thickness varies in response to the wavelength and absorption coefficient in the polycrystalline silicon for the laser light used. Specifically, for the silicon film to be effectively heated without surface damage and for essentially the entire film thickness to be melted, letting x in Equation 1 be the semiconductor film thickness d, the conditions satisfy an $I_{(d)}/I_{(0)}$ between 0.5 and 0.9.

$$0.5 < I_{(d)}/I_{(0)} < 0.9 \quad \text{(Equation 2)}$$

Using Equation 1 in Equation 2 and solving for d yields $$0.105 \cdot m_{pSi}^{-1} < d < 0.693 \cdot m_{pSi}^{-1} \quad \text{(Equation 3).}$$

Similarly, for the silicon film to be effectively heated and the initiation of lateral grain growth to form large grains, $I_{(d)}/I_{(0)}$ is between 0.667 and 0.9 and therefore, $$0.405 \cdot m_{pSi}^{-1} < d < 0.693 \cdot m_{pSi}^{-1} \quad \text{(Equation 4).}$$

When the semiconductor film thickness d and the polycrystalline silicon absorption coefficient $m_{pSi}$ of the pulsed laser light used to irradiate the semiconductor film satisfy Equations 3 and 4 above, it is possible to produce superior polycrystalline semiconductor thin films and consequently superior thin film semiconductor devices.

Figure 4:
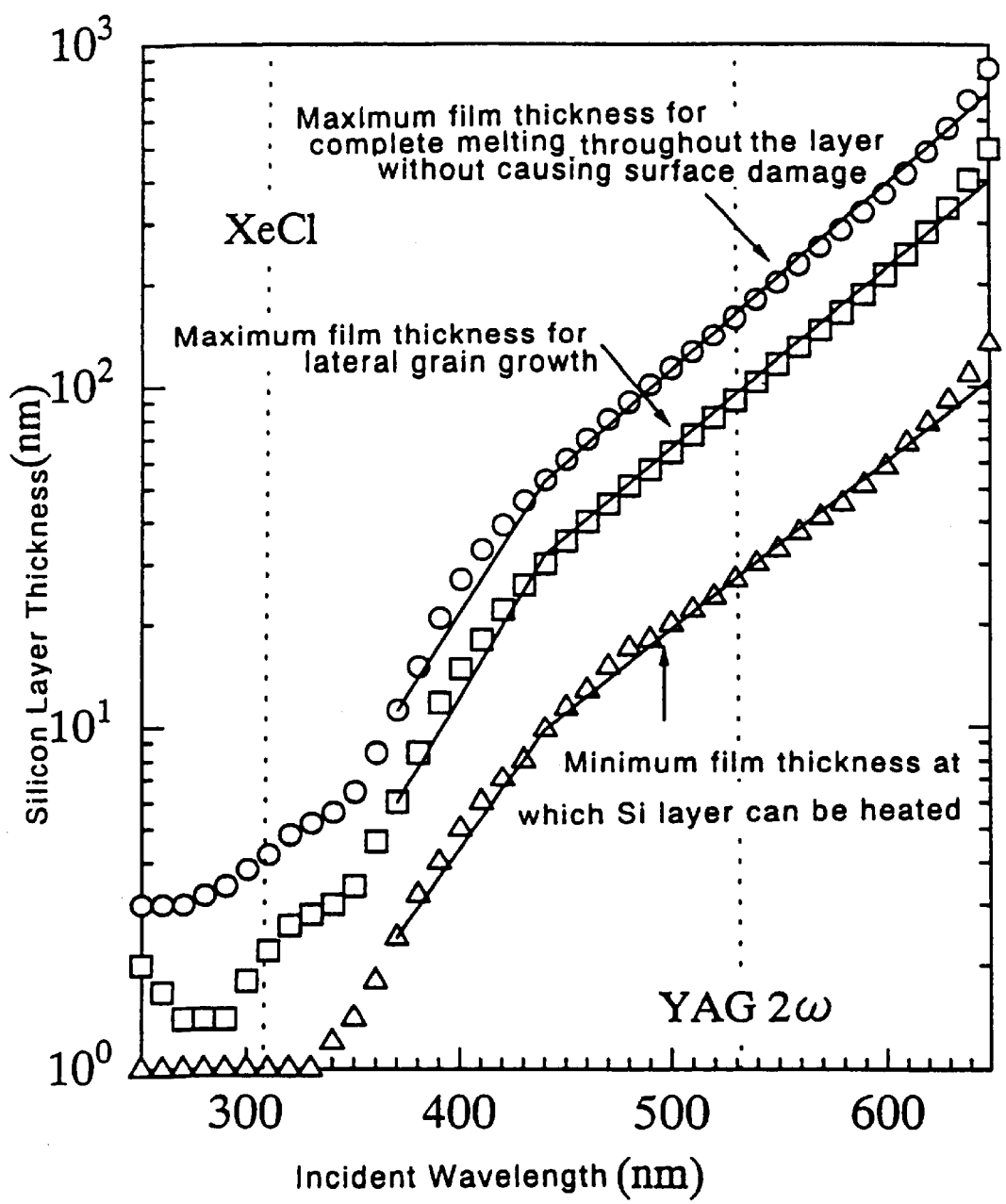
FIG. 4 shows an exemplary relationship between the wavelength and semiconductor film thickness which explains the range of an exemplary embodiment of the present invention.

Taking the relationship between wavelength and absorption shown in FIG. 1 into account, the relationships described above in Equations 3 and 4 are replotted in FIG. 4 in terms of the relationship between wavelength and the thickness of the semiconductor thin film comprised mainly of silicon. The region above the open triangles in FIG. 4 is the region in which the semiconductor thin film is heated, and the region below the open circles in FIG. 4 is the region in which the irradiation energy density is such that there is no surface damage and the entirety of the semiconductor film thickness is relatively uniformly melted. Additionally, because the temperature differential between the top and bottom of the film is minimal in the region shown below the open squares in FIG. 4, grain growth can proceed laterally. In FIG. 4, the open circles, open squares, and open triangles can all be approximated by lines. Using these linear fits, for an irradiation wavelength 1 between 440 nm and 710 nm, if the wavelength 1 and film thickness d satisfy $$9.8 \times 10^{aL2(1-440)} < d < 53 \times 10^{aH2(1-440)} \quad \text{(Equation 5)}$$

in which
aL2=4.9×10$^{-3}$ nm$^{-1}$ and
aH2=5.4×10$^{-3}$ nm$^{-1}$,
the semiconductor thin film consisting mainly of silicon can be effectively heated, and essentially the entire thickness of the semiconductor film can be melted without causing surface damage. For example, using the YAG 2w for the laser, the semiconductor film thickness which satisfies these conditions is between 28 nm and 166 nm because the YAG 2w wavelength is 532 nm. Further, if the film thickness d and wavelength 1 satisfy $$9.8 \times 10^{aL2(1-440)} < d < 32 \times 10^{aM2(1-440)} \quad \text{(Equation 6)}$$

in which
aL2=4.9×10$^{-3}$ nm$^{-1}$ and
aM2=5.2×10$^{-3}$ nm$^{-1}$, the situation is even more favorable because the semiconductor thin film consisting mainly of silicon can be effectively heated and grain growth can proceed laterally. If the YAG 2w wavelength is used, a semiconductor film thickness between 28 nm and 96 nm satisfies the condition in Equation 6.

Similarly, for an irradiation wavelength 1 between 370 nm and 440 nm, if the wavelength 1 and film thickness d satisfy $$2.4 \times 10^{aL1(1-370)} < d < 11.2 \times 10^{aH1(1-370)} \quad \text{(Equation 7)}$$

in which
aL1=8.7×10$^{-3}$ nm$^{-1}$ and
aH1=9.6×10$^{-3}$ nm$^{-1}$,
the semiconductor thin film consisting mainly of silicon can be effectively heated and essentially the entire thickness of the semiconductor film can be melted without causing surface damage. If the wavelength 1 and film thickness d satisfy $$2.4 \times 10^{aL1(1-370)} < d < 6.0 \times 10^{aM1(1-370)} \quad \text{(Equation 8)}$$

in which
aL1=8.7×10$^{-3}$ nm$^{-1}$ and
aM1=1.04×10$^{-2}$ nm$^{-1}$,
the situation is even more favorable because the semiconductor thin film consisting mainly of silicon can be effectively heated and grain growth can proceed laterally.

It is also important to control the irradiation energy density of the pulsed laser light on the semiconductor film in order to obtain high quality crystalline semiconductor thin films. In other words, to produce superior thin film semiconductor devices, control of the irradiation energy density within an appropriate range is essential. First, in order for melt crystallization to occur, it is necessary to have a laser light having sufficient intensity to melt at least a portion of the irradiated semiconductor film. This is the absolute minimum value of the appropriate range for the irradiation energy density of the pulsed laser light on the surface of the semiconductor film. (Because, this usually corresponds to the irradiation energy density for melting of the extreme surface layer, this value is referred to as the "surface melting energy density" ($E_{SM}$) in the present patent disclosure.) Next, experiments have shown that high quality crystalline semiconductor films can be obtained when the pulsed laser light energy density is able to melt a volume fraction of $2/3$ or greater of the thickness of the irradiated semiconductor film. As a result, thin film semiconductor devices which use such crystalline semiconductor films for the active layer display excellent electrical characteristics. This is because high quality crystalline films can be easily obtained by repeatedly melting, even when the number of irradiation repetitions is low, $2/3$ or more of the semiconductor film thickness by making use of the fact that the pulsed laser light of the present invention preferentially melts the film beginning at locations of structural disorder such as those in the non-crystalline regions, simultaneously selectively leaves the high quality crystalline component, and also allows essentially the entire thickness of the thin film to melt uniformly. Consequently, a better lower limit is the irradiation energy density which produces melting of a volume fraction of $2/3$ or more of the thickness of the semiconductor film. (This irradiation energy density is referred to as the "$2/3$ melting energy density" ($E_{2/3}$) in the present patent disclosure.)

There is also a maximum value for the appropriate irradiation energy density. If the laser light energy density on the surface of the semiconductor film is too high, the semiconductor film is ablated; and naturally it is necessary to keep the energy density less than the value at which ablation occurs. (The irradiation energy density for ablation is referred to as the "ablation energy density" ($E_{Ab}$) in the present patent disclosure.) This value is the absolute maximum. Further, even when ablation does not occur across the entire surface, localized ablation can occur easily if the entire thickness of the semiconductor film is completely melted (this irradiation energy density is referred to as the "complete melting energy" ($E_{CM}$) in the present patent disclosure.) Because these areas lead to defects during the production of thin film semiconductor devices and therefore result in yield losses, they are obviously not desirable. Additionally, complete melting of the thickness of the semiconductor film causes explosive generation of crystal nuclei within the film and causes the crystalline films obtained following laser irradiation to be composed of microcrystals. When this occurs, the result is undesirable electrical characteristics in the thin film semiconductor devices. Consequently, for the production of high quality thin film semiconductor devices with high yields, a value of the pulsed laser light energy density at the surface of the semiconductor which is lower than the value for complete melting of the thickness of the semiconductor film ($E_{CM}$) is desirable. This value becomes the desirable upper limit for the appropriate irradiation energy density.

Figure 5:
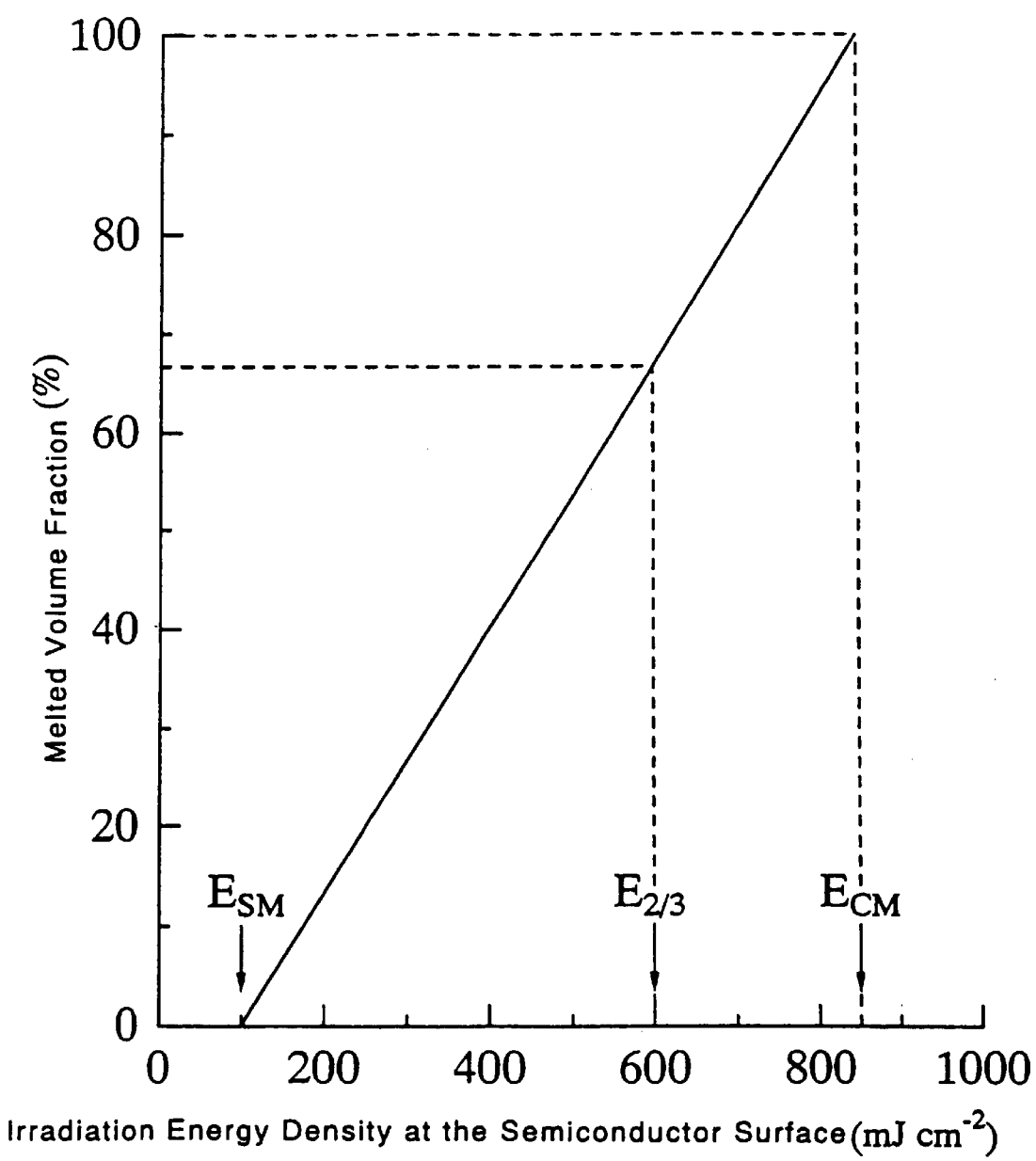
FIG. 5 shows an exemplary relationship between energy density and volume fraction for one example of the present invention.

Ultimately then, when producing thin film semiconductor devices by irradiating semiconductor films composed mainly of silicon and satisfying the thickness requirements presented in Equations 5 through 8 using a solid-state laser with a wavelength between 370 nm and 710 nm, the preferred irradiation energy density of the solid-state laser on the semiconductor film is greater than the surface melting energy density ($E_{SM}$) and less than the ablation energy density ($E_{Ab}$). Actually a more desirable value is greater than the surface melting energy density ($E_{SM}$) and less than the complete melting energy density ($E_{CM}$), or greater than the $2/3$ melting energy density ($E_{2/3}$) and less than the ablation energy density ($E_{Ab}$). Ideally, this value is greater than the $2/3$ melting energy density ($E_{2/3}$) and less than the complete melting energy density ($E_{CM}$). Specifically, for the case of the second harmonic of the solid-state pulsed Nd: YAG laser and a semiconductor film thickness between about 28 nm and 96 nm for a semiconductor film composed mainly of silicon on a transparent substrate, the relationship between the YAG 2w pulsed laser light irradiation energy density on the surface of the semiconductor film (x-axis) and the volume fraction of the irradiated semiconductor film which is melted (y-axis) is shown in FIG. 5. As can be seen from FIG. 5, under the conditions described above $E_{SM}$=100 mJ cm$^{-2}$ $E_{CM}$=850 mJ cm$^{-2}$ $E_{Ab}$=1500 mJ cm$^{-2}$ and the irradiation energy density for melting a volume fraction of $2/3$ of the thickness of the irradiated semiconductor film is $E_{2/3}$=600 mJ cm$^{-2}$.

Therefore, the desirable irradiation energy density for the YAG 2w on the semiconductor film is greater, than 100 mJ cm$^{-2}$ and less than 1500 mJ cm$^{-2}$. A more desirable value is greater than 100 mJ cm$^{-2}$ and less than 850 mJ cm$^{-2}$, and ideally, the value will be greater than 600 mJ cm$^{-2}$ and less than 850 mJ cm$^{-2}$.

Figure 6A:
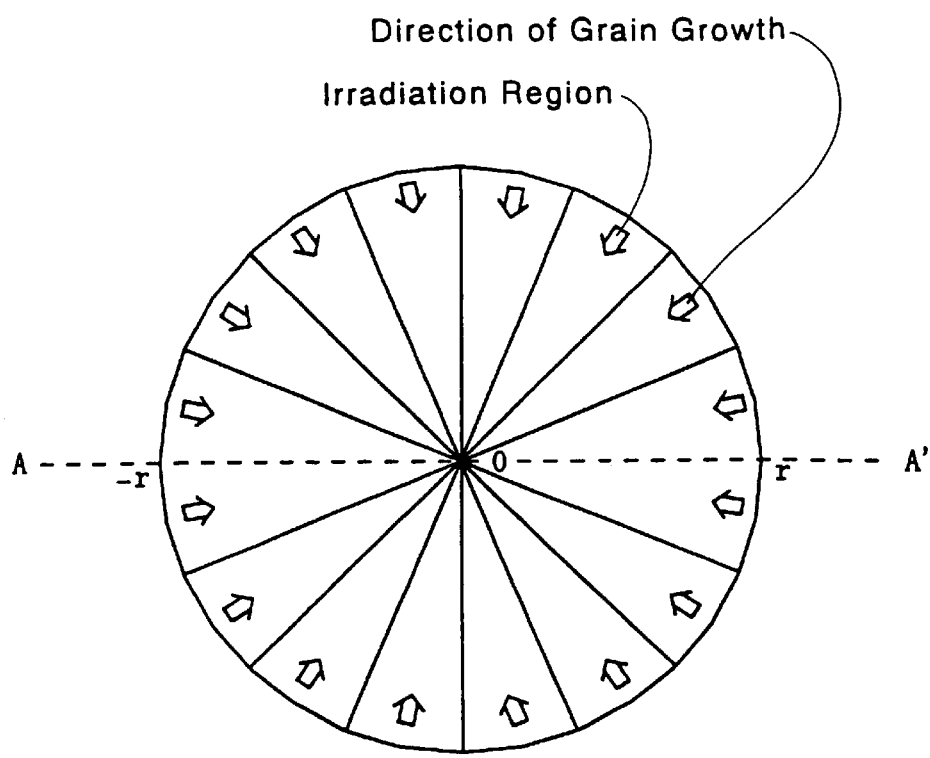
FIG. 6 explains an exemplary irradiation pattern of laser light.
Figure 6B:
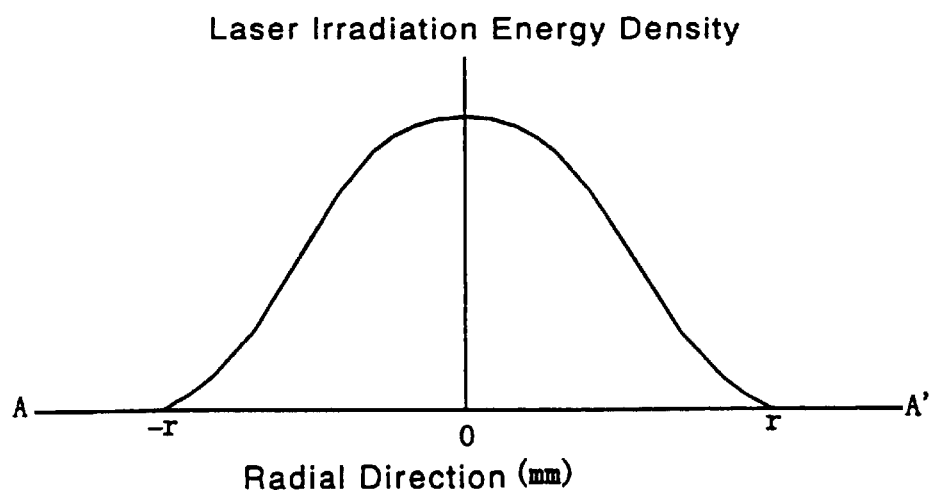
Figure 7A:
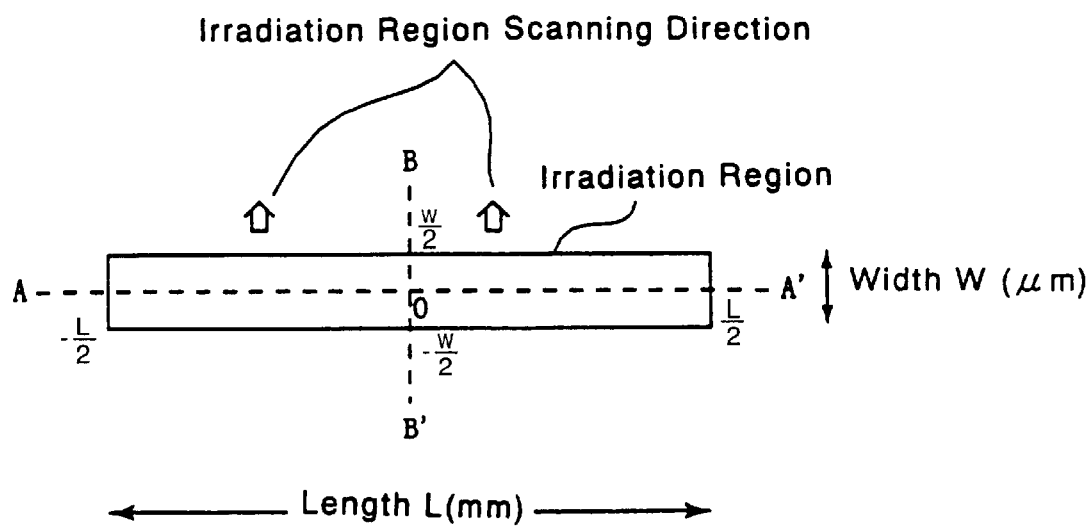
FIG. 7 explains an exemplary irradiation pattern of the laser light according to one exemplary embodiment of the present invention.
Figure 7B:
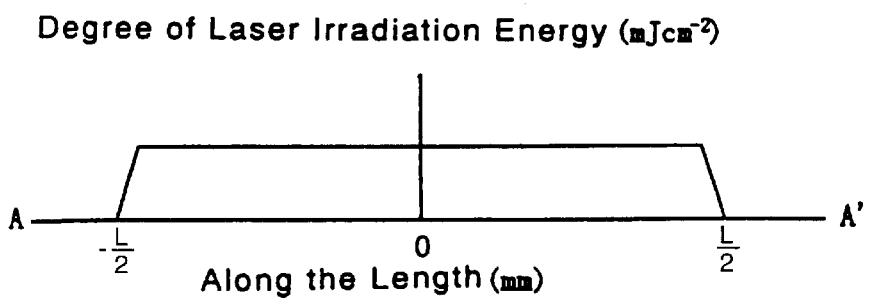
Figure 8A:
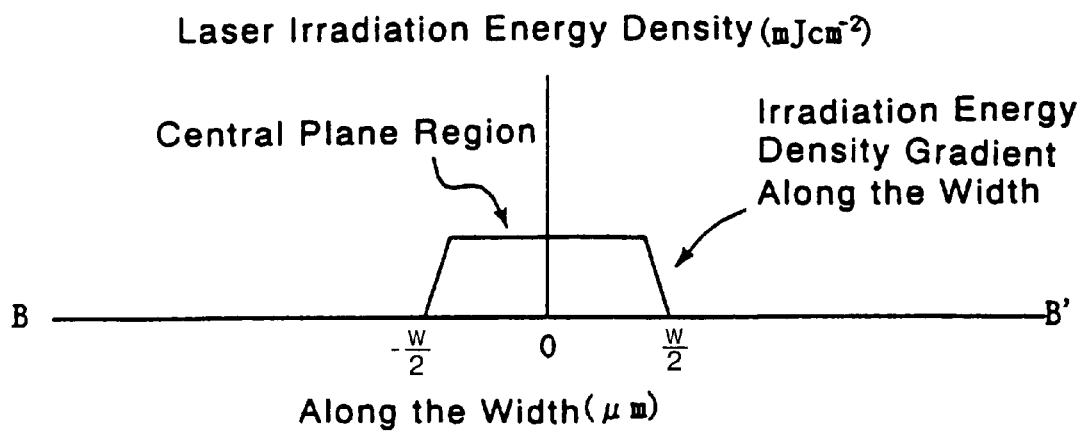
FIG. 8 explains an exemplary irradiation pattern of the laser light according to one exemplary embodiment of the present invention.
Figure 8B:
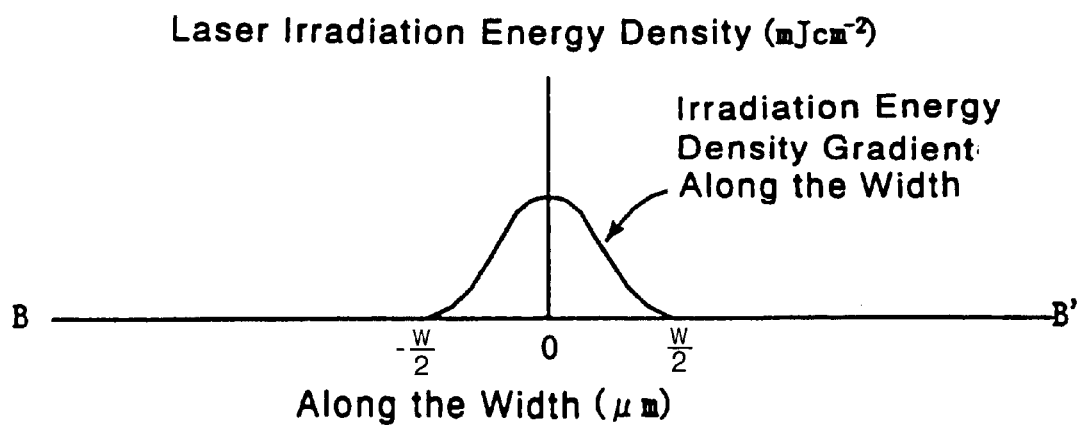
Figure 9A:
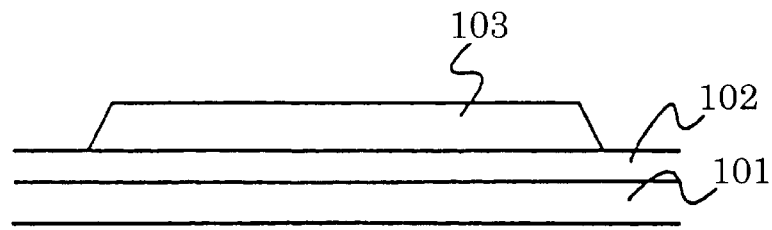
FIG. 9 shows an exemplary fabrication procedure for an exemplary embodiment of the present invention.
Figure 9B:
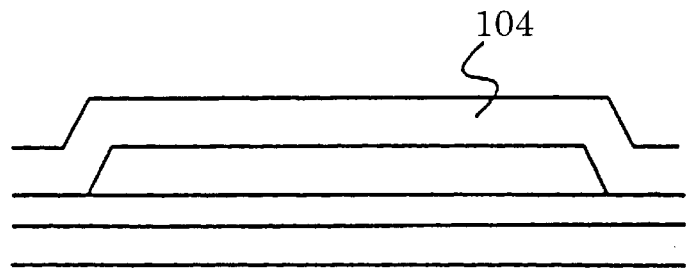
Figure 9C:
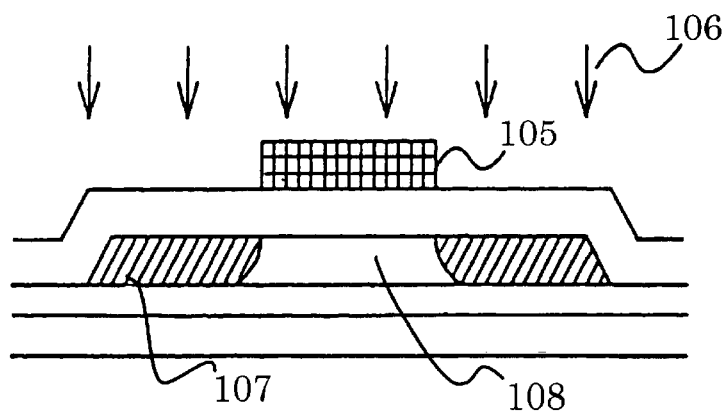
Figure 9D:
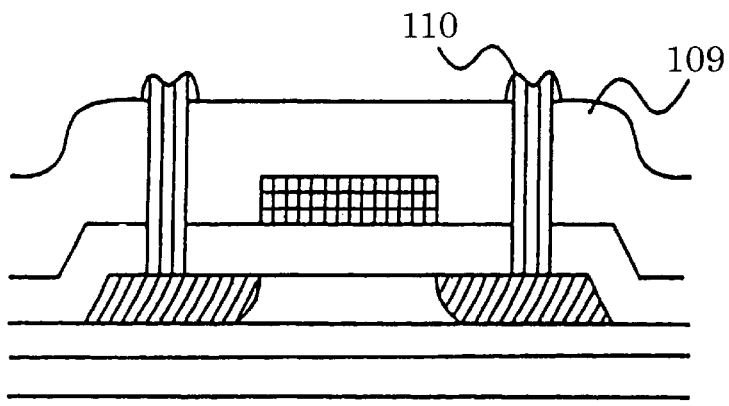

In order to effect lateral grain growth mentioned previously as well as to effectively apply it to semiconductor devices, it is also important to control the profile of the pulsed laser light irradiation region on the surface of the semiconductor film in addition to the other conditions which have been mentioned above. For example, consider the case of a circular beam profile for the irradiation region as shown in FIG. 6-a in which the laser intensity decreases from the center to the periphery (FIG. 6-b). Because the grains grow from the low temperature periphery to the high temperature center in such a case, the grains will collide; and the result is that a large grain size is not obtained. Additionally, regardless of the direction of the active region (the source•channel•drain direction for FETs and the emitter•base•collector direction for bipolar transistors) of the semiconductor devices, there will inevitably be many grain boundaries within the active region so that even if the thin film semiconductor devices are produced with laser annealing, superior semiconductor devices will not be obtained with such an irradiation region beam profile. In contrast, the irradiation region in the present invention assumes a linear or essentially rectangular profile with a width W (mm) and length L (mm) (FIG. 7-a). The laser irradiation energy density along a lengthwise cross-section of the irradiation region (cross-section A–A' in FIG. 7-a) is essentially uniformly distributed (FIG. 7-b) except at the edges of the irradiation region (near±L/2 in FIG. 7-b). Specifically, except for 5% at the left and right edges respectively along the length, the energy density variation (the ratio of the standard deviation with respect to the mean) within the central 90% is less than about 5%. On the other hand, the laser irradiation energy density along a widthwise, or lateral, cross-section of the irradiation region (cross-section B–B' in FIG. 7-a) is essentially a trapezoid (FIG. 8-a) or a Gaussian profile (FIG. 8-b). When the lateral cross-section is Gaussian, this means not only that the laser intensity in the lateral direction (FIG. 8-b) actually assumes a profile approximating a Gaussian distribution, but also that the intensity decreases smoothly from the center (the 0 point in FIG. 8-b) to the edge regions (the areas near±W/2 in FIG. 8-b) as a differentiable function. When the lateral cross-section has a trapezoidal profile (FIG. 8-a), it is desirable for the central flat region which has a variation in the energy density distribution of less than about 5% to account for 30% to 90% of the total profile, which means that the upper and lower edge regions each account for between 5% and 35%. For example, if W=100 mm, it is desirable for the central flat region to be from 30 mm to 90 mm and each of the edge regions to be from 5 mm to 35 mm.

The main point of the present invention is the ability to effect lateral growth during melt crystallization through the control of factors such as crystal nuclei and the laser light. To effect lateral growth, in addition to the suppression of grain growth in the direction of the film thickness by means of the choice of the laser source and the matching semiconductor film thickness, control of film growth in the horizontal direction is also important. Specifically, through the optimization of the ratio (L/W) of the length L (abbreviated as the "irradiation length") of the linear or rectangular laser light irradiation region to the width W of the same region (abbreviated as the "irradiation width") as well as the irradiation region scanning scheme, it is possible to produce grain growth in the desired direction. First assume an irradiation length to irradiation width ratio (L/W) of 100 or higher. If the (L/W) ratio is higher than about 100, with each laser shot, the temperature gradient along the irradiation length is essentially non-existent and most of the gradient exists in the lateral direction (direction B–B' in FIG. 7-a). As a result, the grains exhibit one-dimensional lateral grow along the width of the irradiation region. Because it is preferable to have the irradiation width between about 5 mm and 500 mm, a ratio (L/W) of 1000 or higher is ideally desirable from the perspective of manufacturability. Next, the irradiation region with the profile described is translated in the lateral direction with each laser shot and scans the entire surface of the substrate. Because the grains grow laterally along the irradiation width with each laser shot, it is possible for multiple grains to coalesce in the lateral direction if the irradiation region is translated laterally. By using this type of irradiation scheme, the grains which compose the polycrystalline semiconductor film become large on average along the irradiation region width (direction B–B' in FIG. 7-a). Consequently, by taking the direction of the active region of the thin film semiconductor devices (the source•drain direction for MOSFETs and the emitter•collector direction for bipolar transistors) to be in the direction of the irradiation width, it is possible to realize superior thin film semiconductor devices with either no or very few grain boundaries within the active region (within the MOSFET channel formation region or the bipolar transistor emitter•base junction region, base region and the base•collector junction region).

In scanning the laser irradiation region over the substrate, it is desirable for the amount of translation of the irradiation region with each laser shot (this is abbreviated as the "amount of translation") to be less than the amount of grain growth from a single laser shot (this is abbreviated as "grain growth size"). The ideal amount of translation is in the order of half of the grain growth size or less. By so doing, the probability of grains coalescing with each laser shot increases dramatically because the grain diameter increases along the width of the irradiation region. When the YAG 2w is used as the laser source, the grain growth size is usually in the order of 1 mm to 3 mm. Therefore, if the amount of translation is in the order of 3 mm or less, there is a possibility that the grains will coalesce; and the probability that this will happen is even higher if the amount of translation is 2 mm or less. It is not the case that the grain growth size is always about 3 mm, and the grain growth size is distributed according to a given probability function. While the grain growth size will sometimes take on a large value, there are also cases where it can assume a small value. Even if the grain growth size is small, such as in the order of 1 mm, in order for the grains to definitely coalesce, or in other words for the grains to definitely coalesce regardless of the value of the grain growth size, the amount of translation should be in the order of 1 mm or less. Ideally the value should be 0.5 mm or less. If the amount of translation is less than about 0.1 mm, the scanning speed slows to less than 2 mm/sec even though the pulse frequency of the YAG 2w may be as high as 20 kHz. For processing large size substrates in the order of 500 mm in size, a scanning speed of less than about 2 mm/sec is not realistic from a manufacturing perspective. Therefore, the minimum value for the amount of translation can be said to be about 0.1 mm. If throughput takes precedence over the coalescence of grains, the maximum value for the amount of translation is roughly 25 mm.

In the fabrication of high quality thin film semiconductor devices, it is necessary to optimize the number of times a given location on the semiconductor film is irradiated by the pulsed laser light (abbreviated as the "number of laser shots"). If the number of laser shots is less than about 10, it is not possible to effectively reduce the number of defects within the polycrystalline semiconductor film. On the other hand, a number of laser shots greater than about 80 results in problems such as the incorporation of gas impurities into the semiconductor film and a significant increase in the roughness of the semiconductor film surface. Especially if the number of laser shots is 200 or greater, the surface becomes extremely rough. If films of this type are used to fabricate thin film semiconductor devices, the semiconductor devices are completely non-functional as a result of problems such as gate leak. In order to fabricate high quality thin film semiconductor devices while effectively decreasing the defects within the crystalline semiconductor films and also maintaining a level semiconductor film surface, the laser irradiation region should scan the substrate such that the number of laser shots is between about 10 and 80. To assure such high quality semiconductor devices, the pulsed laser light should scan so that the number of laser shots is between about 20 and 60.

Because there are optimum values for the amount of translation and the number of laser shots, the optimum irradiation width W is determined by these values. The irradiation width W is the product of the amount of translation and the number of laser shots. If the amount of translation is x (mm) and the number of laser shots is n, the irradiation width W (mm) is $$W(mm) = x(mm) \cdot n \qquad \text{(Equation 9)}.$$

Regardless of the distribution of the laser energy density along the width, the irradiation width W corresponds to the width at the point at which the intensity of the laser energy density is half of its maximum value (full width half maximum: FWHM). Because the lower limit for the desired range for the amount of translation is about 0.1 mm and the desirable minimum for the number of laser shots is about 10, the desirable minimum irradiation width is about 1 mm; Conversely, because the maximum value for the amount of translation is about 25 mm and the maximum value for the number of laser shots is about 80, the desirable maximum irradiation width is about 2000 mm. A more desirable range for the irradiation width is between 5 mm, corresponding to an amount of translation of 0.5 mm and a number of laser shots of 10, and 240 mm, corresponding to an amount of translation of 3 mm and a number of laser shots of 80. The ideal irradiation width is between 20 mm, corresponding to an amount of translation of 1.0 mm and a number of laser shots of 20 or an amount of translation of 0.5 mm and a number of laser shots of 40, and 120 mm, corresponding to an amount of translation of 2 mm and a number of laser shots of 60.

Under these conditions, the desirable laser pulse frequency matches the order of the scanning speed of 2 mm/sec or higher. Using the previously defined amount of translation x (mm), the relationship between the pulsed laser light pulse frequency f (Hz) and the scanning speed v (mm/sec) can be expressed as $$v(mm/sec)=x(mm)\cdot 10^{-3}\cdot f\ (Hz) \qquad \text{(Equation 10).}$$

Therefore, the desirable pulse frequency f (Hz) is $$f>2\times 10^3/x \qquad \text{(Equation 11).}$$

Because the desirable range for the amount of translation is between about 0.1 mm and 25 mm, the desirable pulse frequency range from Equation 11 is from about 0.08 kHz to 20 kHz. A more desirable range is from about 0.67 kHz to 20 kHz, and an ideal range is from about 1 kHz to 20 kHz. From Equation 9 and Equation 11, the relationship among the pulse frequency f (Hz), the number of laser shots n (number) and the irradiation width W (mm) can be seen to be $$f>2\cdot 10^3\cdot n\ /x \qquad \text{(Equation 12).}$$

In other words, by setting the pulse frequency, number of laser shots and irradiation width to satisfy the condition in Equation 12 and irradiating the semiconductor film with a pulsed laser, it is possible to produce superior quality thin film semiconductor devices with high throughput.

One additional important factor in effecting one dimensional lateral growth of grains along the width during melt crystallization of semiconductor films is the gradient of the laser energy density along the width of the irradiation region (abbreviated as the "energy density gradient.") The grain growth speed u(x) during melt crystallization is proportional to the semiconductor film temperature gradient dT(x)/dx $$u(x)=k\cdot dT(x)/dx \qquad \text{(Equation 13)}$$

in which k is the speed constant, and T(x) is the semiconductor film temperature at a location x on the semiconductor film. Letting the melting time for the semiconductor film be $t_m$, the grain growth size $L_c$ is given by the product of the grain growth speed and the melting time $t_m$ $$L_c=u\cdot L_c=k\cdot dT/dx\cdot t_m \qquad \text{(Equation 14).}$$

Because the speed constant k is fixed and the melting time is also essentially constant, the grain growth size is proportional to the semiconductor film temperature gradient. On the other hand, because the semiconductor film temperature is proportional to the irradiation pulsed laser light energy density, the grain growth size $L_c$ is ultimately proportional to the energy density gradient dE/dx $$L_c \propto dE/dx \qquad \text{(Equation 15).}$$

For the grain growth size to increase, a large energy density gradient is necessary. According to the experimental results of the inventor and others, during melt crystallization of semiconductor films on glass substrates using the YAG 2w as the pulsed laser source, the grain growth size along the irradiation width was larger than 1 mm when the maximum value of the energy density gradient was larger than about 3 mJ·cm$^{-2}$·mm$^{-1}$, being between about 3.0 mJ·cm$^{-2}$·mm$^{-1}$ and 4.0 mJ·cm$^{-2}$·mm$^{-1}$. Further, when the maximum value of the energy density gradient was between 10 mJ·cm$^{-2}$·mm$^{-1}$ and 20 J·cm$^{-2}$·mm$^{-1}$ the grain growth size along the irradiation width was larger than 2 mm. Also, when the maximum value of the energy density gradient was about 30 mJ·cm$^{-2}$·mm$^{-1}$, the grain growth size along the irradiation width was about 3 mm. Therefore, in order to obtain high quality crystalline semiconductor films and produce excellent thin film semiconductor devices, it is desirable to have the maximum value of the energy density gradient greater than about 3 mJ·cm$^{-2}$ mm$^{-1}$, preferably between 10 mJ·cm$^{-2}$·mm$^{-1}$ and 20 J·cm$^{-2}$·mm$^{-1}$, and ideally greater than about 30 mJ·cm$^{-2}$·mm$^{-1}$.

By means of the present invention, in the realization of unidirectional grain growth in a desired direction, the irradiation laser wavelength, absorption coefficient, semiconductor film thickness and purity are optimized; grain growth along the thickness of the film is suppressed; a linear or rectangular irradiation region beam profile is used, and grain growth along the profile length is suppressed; the energy density gradient is optimized in the lateral direction, and grain growth is effected selectively only in the lateral direction along the width of the profile. Under these conditions, if the irradiation region is scanned by translating the region an appropriate amount in the lateral direction along the width of the irradiation region with each laser shot, the grains will coalesce in the scanning direction. By so doing, the grain length will increase along the irradiation width; and it is possible to obtain superior crystalline semiconductor thin film with minimal intragranualar defects, a planar surface, and high purity. If the direction of the active layer of the thin film semiconductor device is parallel to the scanning direction of the irradiation region, the number of grain boundaries perpendicular to the active layer is significantly reduced, and leads to the ability to easily produce exceptionally good thin film semiconductor devices.

As has been described in detail above, the low quality, large variation crystalline semiconductor films of the prior art can be made into uniform, high quality semiconductor films through the film growth method and crystallization processing of the present invention. As a result, the electrical characteristics of thin film semiconductor devices exemplified by thin film transistors can be remarkably improved. At the same time, the thin film semiconductor devices can be made to operate at low voltages; and it is possible to reliably produce such thin film semiconductor devices.

THE BEST SYSTEMS FOR IMPLEMENTING THE INVENTION

Practical examples of this invention will be described with reference to the accompanying figures.

EXAMPLE 1

FIGS. 9 (a) through (d) are cross-sectional representations of the fabrication process of a MOS field effect transistor thin film semiconductor device. In Example 1, a non-alkali glass with a strain point of 650° C. is used as substrate 101. In fact, as long as the substrate can withstand the maximum processing temperature during the fabrication of the thin film semiconductor device, it is naturally acceptable to use another type of substrate without regard to type or size. First, a silicon oxide layer functioning as underlevel protection layer 102 is deposited on the substrate 101. In the event that the substrate contains impurities which are undesirable in semiconductor films, such as for the case of ceramic substrates, it is desirable to deposit a first underlevel protection layer such as tantalum oxide or silicon nitride prior to deposition of the silicon oxide layer. In this Example 1, a silicon oxide film in the order of 200 nm is deposited on substrate 101 by plasma-enhanced chemical vapor deposition (PECVD) to act as underlevel protection layer 102. The silicon oxide layer was deposited by ECR-PECVD under the following conditions:

| | |
|---|---|
| Monosilane (SiH$_4$) flow rate | 60 sccm |
| Oxygen (O$_2$) flow rate | 100 sccm |
| Pressure | 2.40 mTorr |
| Microwave (2.45 GHz) power | 2250 W |
| Magnetic field | 875 Gauss |
| Substrate temperature | 100° C. |
| Deposition time | 40 seconds. |

The etching rate of this oxide film was 0.5 nm/sec in a 1.67% aqueous hydrogen fluoride acid solution at 25° C.

As the first processing step, an intrinsic amorphous silicon layer in the order of 50 nm thick is deposited on top of the underlevel protection layer, formed as described above, in a high vacuum LPCVD reactor. The high vacuum LPCVD reactor is a hot-wall reactor with a volume of 184.5 l and has a total surface area for deposition of 44,000 cm$^2$ once the substrates have been introduced into the reactor. The maximum exhaust rate of the deposition chamber is 120 sccm/mTorr. The deposition temperature is 425° C., and the substrates undergo a thermal drying process step at this temperature for 1 hour and 15 minutes prior to deposition of the semiconductor film. In the middle of the thermal drying process step, 200 sccm of at least 99.9999% pure helium (He) and 100 sccm of at least 99.9999% pure hydrogen (H$_2$) are introduced into the deposition chamber containing the substrates; and the deposition chamber is maintained at a pressure of approximately 2.5 mTorr. After the completion of the thermal drying process step, the background pressure of the deposition chamber just prior to deposition of the semiconductor film is 2.5×10$^{-7}$ Torr under the equilibrium temperature conditions at 425° C. During deposition of the amorphous silicon layer, at least 99.99% pure disilane (Si$_2$H$_6$) is supplied at a flow rate of 200 sccm; and the deposition pressure is maintained at roughly 1.1 Torr. The deposition rate of the silicon film is 0.77 nm/min under these deposition conditions.

Next, in the second processing step, the intrinsic amorphous silicon layer obtained in the first processing step is melt crystallized by irradiation with the second harmonic of a pulsed Nd: YAG laser. The time half-width of the pulsed laser is approximately 60 nanoseconds, and the pulse frequency is 200 Hz. The laser pulse has an approximately Gaussian distribution along its width, and the beam is focussed into a line profile having an irradiation width of 270 mm and an irradiation length of 5 mm. The maximum in the energy density gradient along the width of the pulse is 3.72 mJ·cm$^{-2}$·mm$^{-1}$. The laser line profile is scanned over the substrate by translating the beam 2.5% along its width after each irradiation. The amount of translation is 6.75 mm so that a given point on the semiconductor film is irradiated approximately 40 times. The irradiation energy density of the laser is 750 mJ·cm$^{-2}$. The variation of the average irradiation energy density at the surface of the semiconductor film is roughly 4%. In this Example 1, because the energy density for melting only the very surface of the 50 nm semiconductor film using the YAG 2w laser was 100 mJ·cm$^{-2}$ whereas the energy density for complete melting was 850 mJ·cm$^{-2}$, approximately 87% of the semiconductor film was melted. The crystalline silicon layer obtained in this fashion was then patterned to produce semiconductor film island 103. The direction of the transistor source and drain and the scanning direction of the YAG 2w laser were roughly parallel (FIG. 9-a).

Next, silicon oxide layer 104 was formed by ECR-PECVD in order to cover patterned semiconductor film island 103. This silicon oxide layer serves as the gate insulator layer for the semiconductor device. With the exception of a shortened deposition time of 24 seconds, the deposition conditions of the gate insulator silicon oxide layer are the same as the deposition conditions of the underlevel protection layer silicon oxide layer. Just prior to the deposition of the silicon oxide layer, however, the substrate was irradiated by an oxygen plasma inside the ECR-PECVD reactor to create a low temperature plasma oxide layer on the surface of the semiconductor film. The plasma oxidation conditions are as given below:

| | |
|---|---|
| Oxygen (O$_2$) flow rate | 100 sccm |
| Pressure | 1.85 mTorr |
| Microwave (2.45 GHz) power | 2000 W |
| Magnetic field | 875 Gauss |
| Substrate temperature | 100° C. |
| Deposition time | 24 seconds. |

As a result of the plasma oxidation, a roughly 3.5 nm oxide layer is formed on the surface of the semiconductor film. Following completion of the oxygen plasma irradiation, the oxide layer is deposited in a consecutive fashion without breaking vacuum in the system. Consequently, the silicon oxide layer that comprises the gate insulator is composed of both a plasma oxide layer and a vapor deposited layer with a total thickness of 122 nm. Gate insulator layer formation is completed in this manner (FIG. 9-b).

Next, gate electrode 105 comprised of a metal thin film is formed by sputtering. The substrate temperature during sputtering was 150° C. In this Example 1, the gate electrode was formed by a 750 nm thick alpha tantalum (Ta) film with a sheet resistivity of 0.8 W/square. Next, using the gate electrode as a mask, donor or acceptor impurity ions 106 are implanted in order to form source and drain regions 107 and channel region 108 in a self-aligned manner with respect to the gate electrode. In this Example 1, CMOS semiconductor devices were fabricated. During formation of the NMOS transistors, the PMOS transistor regions were covered by a thin film of aluminum (Al); and phosphine (PH$_3$), chosen as the source of impurity ions and diluted to a concentration of 5% in hydrogen, was implanted into the NMOS source and drain regions at an accelerating voltage of 80 kV to produce a total ion concentration, including hydrogen, of 7×10$^{15}$ cm$^{-2}$. On the other hand, during formation of the PMOS transistors, the NMOS transistor regions were covered by a thin film of aluminum (Al); and diborane (B$_2$H$_6$), chosen as the source of impurity ions and diluted to a concentration of 5% in hydrogen, was implanted into the PMOS source and drain regions at an accelerating voltage of 80 kV to produce a total ion concentration, including hydrogen, of 5×10$^{15}$ cm$^{-2}$ (FIG. 9-c). The substrate temperature during implantation was 300° C.

Next, interlevel dielectric layer 109 was deposited at a substrate temperature of 300° C. by PECVD using TEOS (Si—(OCH$_2$CH$_3$)$_4$) and oxygen as the source gases. The interlevel dielectric layer is comprised of silicon dioxide and has a thickness of approximately 500 nm. After interlevel dielectric layer deposition, the devices are annealed in a nitrogen atmosphere at 350° C. for two hours in order to both densify the interlevel dielectric layer and also activate the impurity elements residing in the source and drain regions. Finally, contact holes are opened; aluminum is sputter deposited at a substrate temperature of 180° C.; interconnects 110 are formed; and the thin film semiconductor device is completed (FIG. 9-d).

The transfer characteristics of thin film semiconductor devices fabricated in the manner described above were measured. The channel region of the measured semiconductor devices was 10 mm in both length and width; and the measurements were performed at room temperature. For four NMOS transistors measured with Vds=8V, the average mobility determined from the saturation region was 117 $cm^2 \cdot V^{-1} \cdot sec^{-1}$, the average threshold voltage was 3.41 V, the average subthreshold swing was 0.260 V, and the average density of acceptor-like states determined from the threshold voltage and flat band voltage was $2.05 \times 10^{16}$ $cm^{-3}$. Similarly, for four PMOS transistors measured with Vds=-8V, the average mobility determined from the saturation region was 62 $cm^2 \cdot V^{-1} \cdot sec^{-1}$, the average threshold voltage was -0.81 V, the average subthreshold swing was 0.368 V, and the average density of donor-like states determined from the threshold voltage and flat band voltage was $1.62 \times 10^{16}$ $cm^{-3}$. The characteristics of transistors like these were essentially unchanged over the substrate indicating that high performance semiconductor devices were uniformly produced. In contrast to these results, transistors fabricated using the prior art in which the deposited amorphous silicon layer was crystallized by an excimer laser produced the following results. For NMOS transistors, the average mobility was 33 $cm^2 \cdot V^{-1} \cdot sec^{-1}$, the average threshold voltage was 3.70 V, the average subthreshold swing was 0.646 V, and the average density of acceptor-like states was $2.65 \times 10^{16}$ $cm^{-3}$. For PMOS transistors, the average mobility was 16 $cm^2 \cdot V^{-1} \cdot sec^{-3}$, the average threshold voltage was -7.06 V, the average subthreshold swing was 0.617 V, and the average density of donor-like states was $6.55 \times 10^{16}$ $cm^{-3}$. As this example shows, by means of the present invention, both N-type and P-type semiconductor devices possess high mobility and low threshold voltages. Further, it is possible to produce excellent thin film semiconductor devices displaying steep subthreshold characteristics conveniently, simply, and reliably by means of a low temperature process which can use conventional glass substrates. In particular, the greatest effect of the present invention is to significantly reduce the density of trap states such as those near the center of the band gap and the donor-like states as can be seen from the values for the subthreshold swing which allows low voltage driving of circuits using thin film semiconductor devices. Furthermore, in the technology of the prior art, if the mobility were high, the threshold voltage and density of trap states were also increased; but by means of the present invention, it is possible to achieve the remarkable result of simultaneously achieving high mobility and low threshold voltage and low trap state densities.

EXAMPLE 2

With the exception of the irradiation of the semiconductor film by the second harmonic of the pulsed Nd:YAG laser in the second processing step, thin film semiconductor devices are produced using exactly the same fabrication process steps as described in Example 1. Example 2 differs from Example 1 in only the two areas of (1) the degree of translation of the 270 mm wide, 5 mm long, line profile YAG 2w pulsed laser light after each irradiation, and (2) the irradiation energy density of the laser light on the semiconductor film. Four standards corresponding to translation of the laser light in the direction of the beam width of 5%, 2.5%, 1.2% and 0.6% after each irradiation were selected. As a result, a given location on the semiconductor film would receive approximately 20, 40, 83, and 250 laser irradiations, respectively, corresponding to the four degrees of translation. The laser light irradiation energy density on the semiconductor film was varied from 300 $mJ \cdot cm^{-2}$ to 800 $mJ \cdot cm^{-2}$. The peaks in the laser energy density gradient vary proportionally from 1.49 $mJ \cdot cm^{-2} \cdot mm^{-1}$ to 3.97 $mJ \cdot cm^{-2} \cdot mm^{-1}$. As in Example 1, the variation of the YAG 2w laser irradiation energy density on the semiconductor film with respect to the average is approximately 4%, and $E_{SM}$ is in the order of 100 $mJ \cdot cm^{-2}$ while $E_{CM}$ is in the order of 850 $mJ \cdot cm^{-2}$.

The electrical characteristics of thin film semiconductor devices fabricated in this fashion are shown in FIGS. 10 to 15. In these figures, the horizontal axis (x-axis) in all cases is the irradiation energy density of the YAG 2w laser light at the surface of the semiconductor film while the vertical axis (y-axis) shows the corresponding electrical characteristics. Additionally, for the sake of comparison, the best results obtained by excimer laser annealing representing the technology of the prior art are shown by the solid black circles (KrF Excimer 20 shots).

Figure 10:
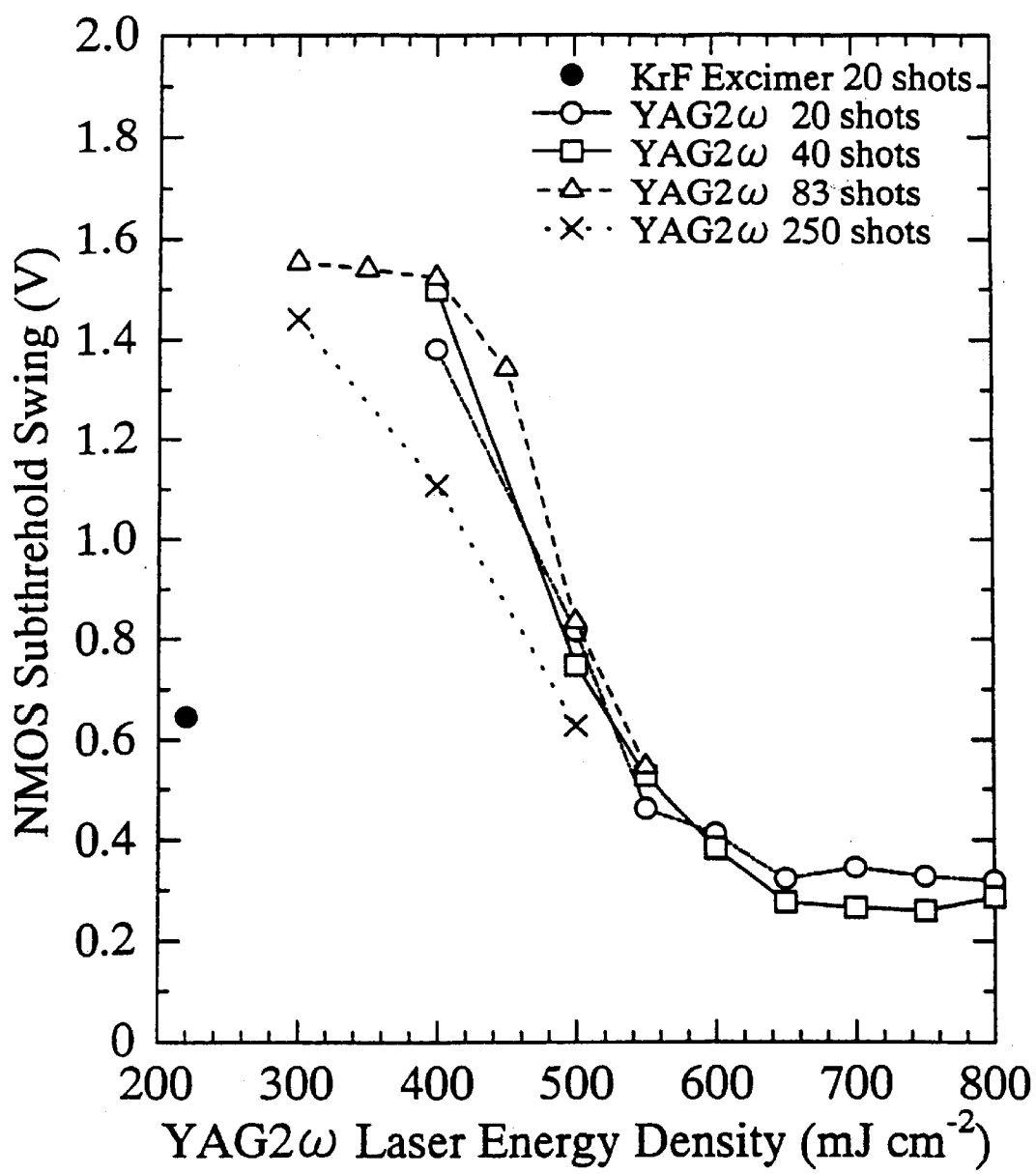
Figure 11:
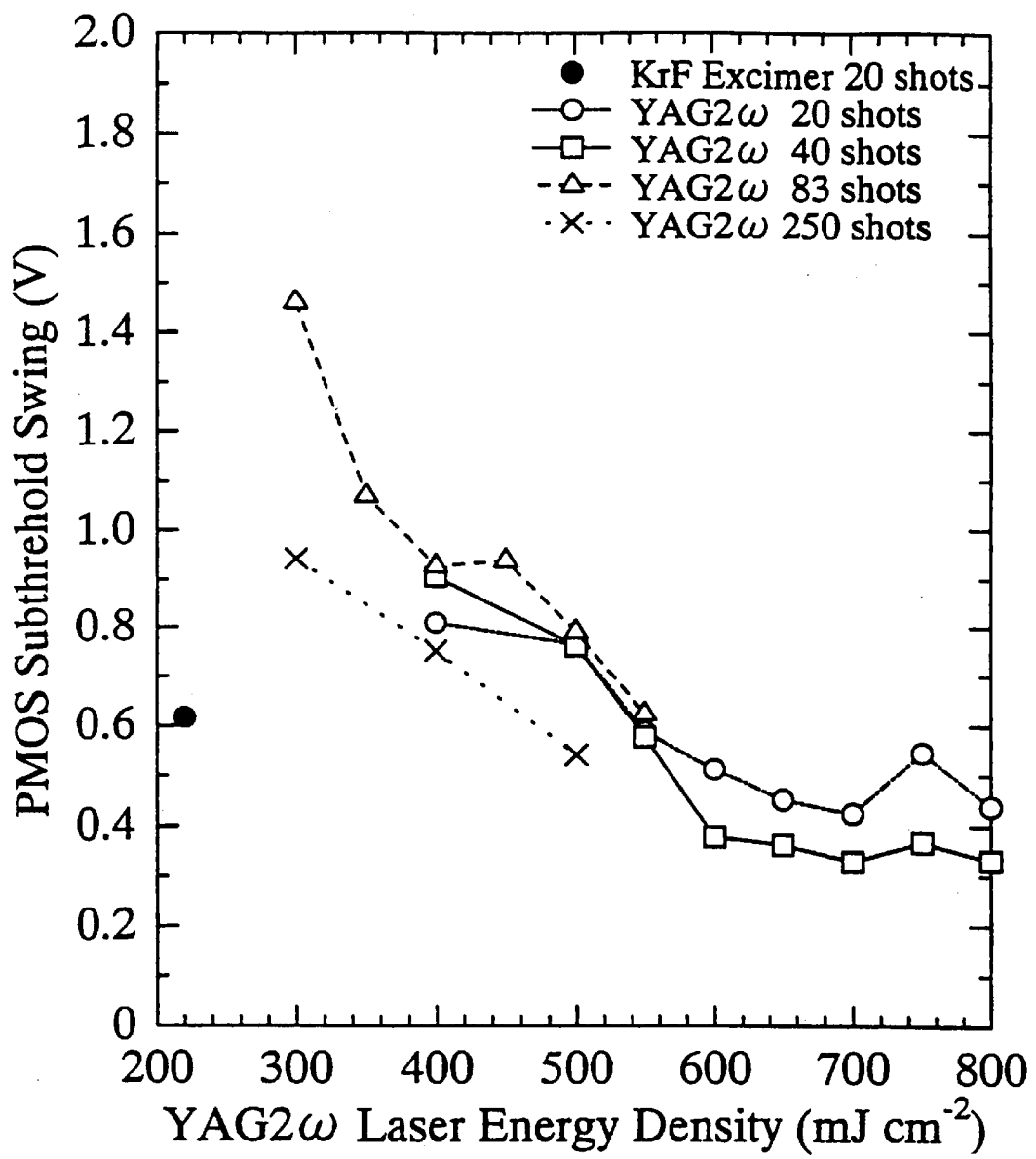

FIGS. 10 and 11 show subthreshold swing data for NMOS and PMOS, respectively. It can be seen that it is possible to improve the characteristics below the threshold value over the previous characteristics by increasing the irradiation energy density above about 550 $mJ \cdot cm^{-2}$, or in other words, melting a volume fraction of 60% or greater along the depth of the semiconductor film. For energy densities greater than about 600 $mJ \cdot cm^{-2}$ (melting a volume fraction of more than about 67% along the depth of the semiconductor film), the characteristics can be improved remarkably over the previous results; and it can be confirmed that range of energy density which shows good characteristics extends to 800 $mJ \cdot cm^{-2}$ just before complete melting.

Figure 12:
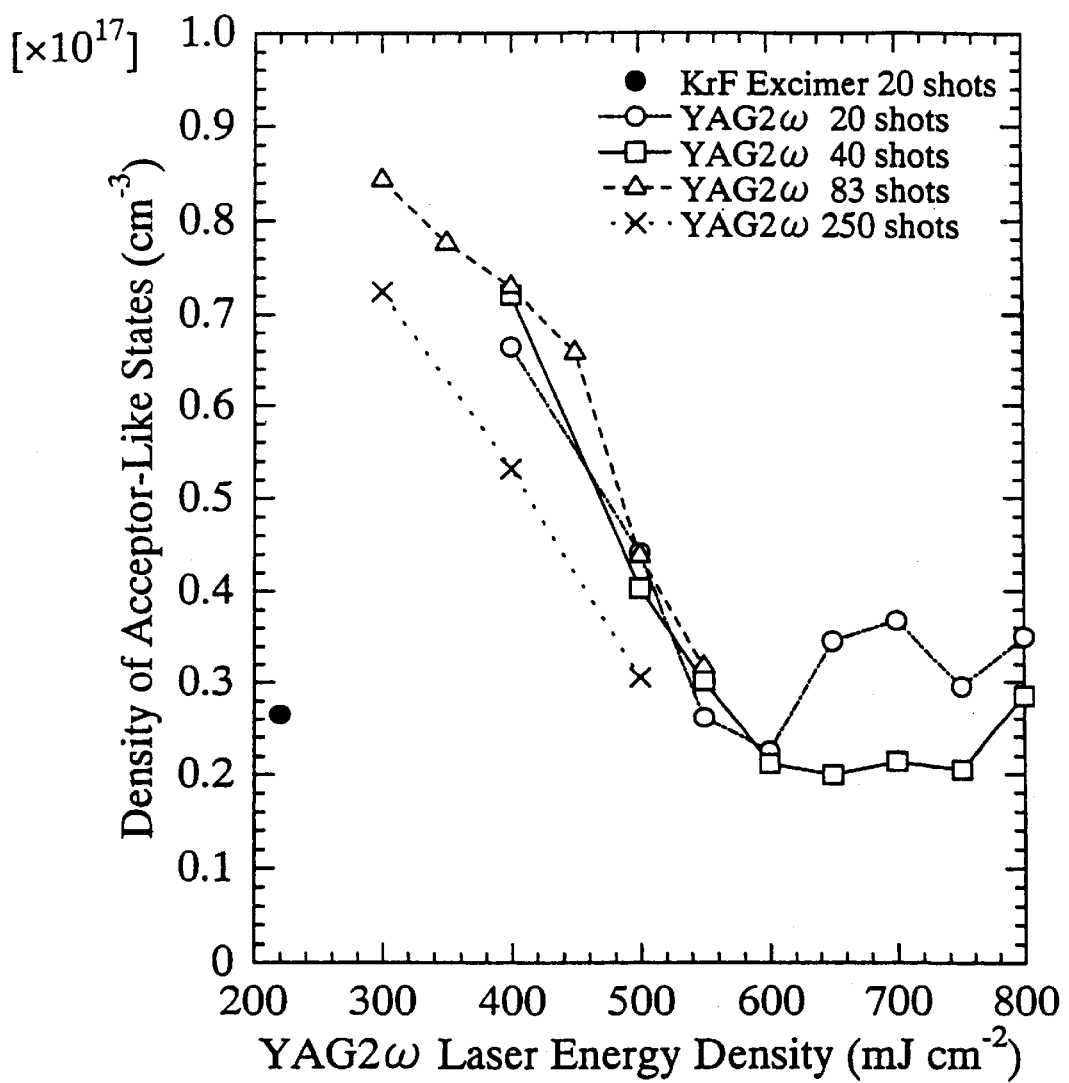
Figure 13:
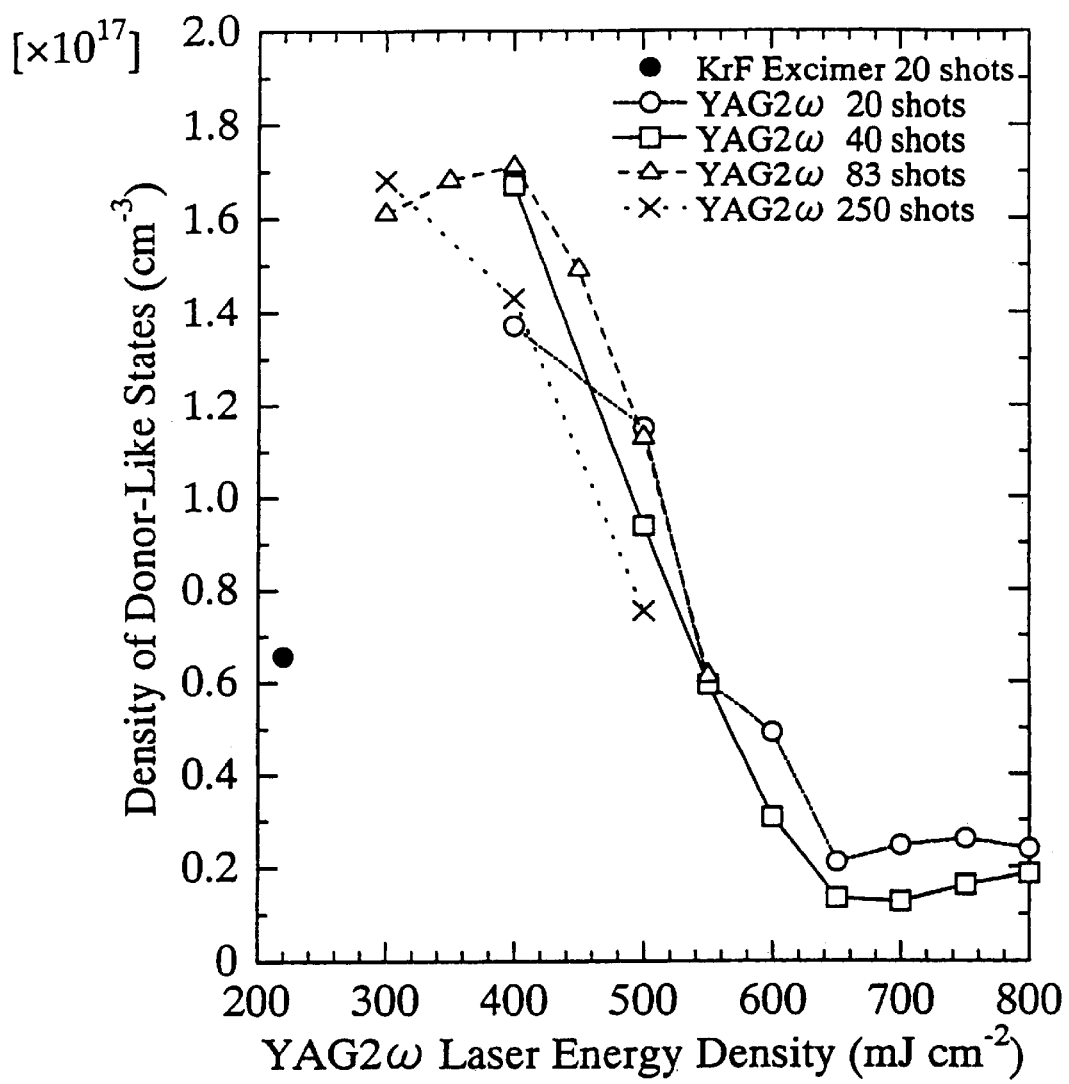

FIGS. 12 and 13 show the dependence of the densities of acceptor-like and donor-like trap states on the laser energy density. In addition to demonstrating the same trends seen in FIG. 10 and 11, by increasing the irradiation energy density above about 650 $mJ \cdot cm^{-2}$, or in other words, melting a volume fraction of 73% or greater along the depth of the semiconductor film, the remarkable result that the density of donor-like states can be decreased to less than one third that of the previous results can be ascertained.

Figure 14:
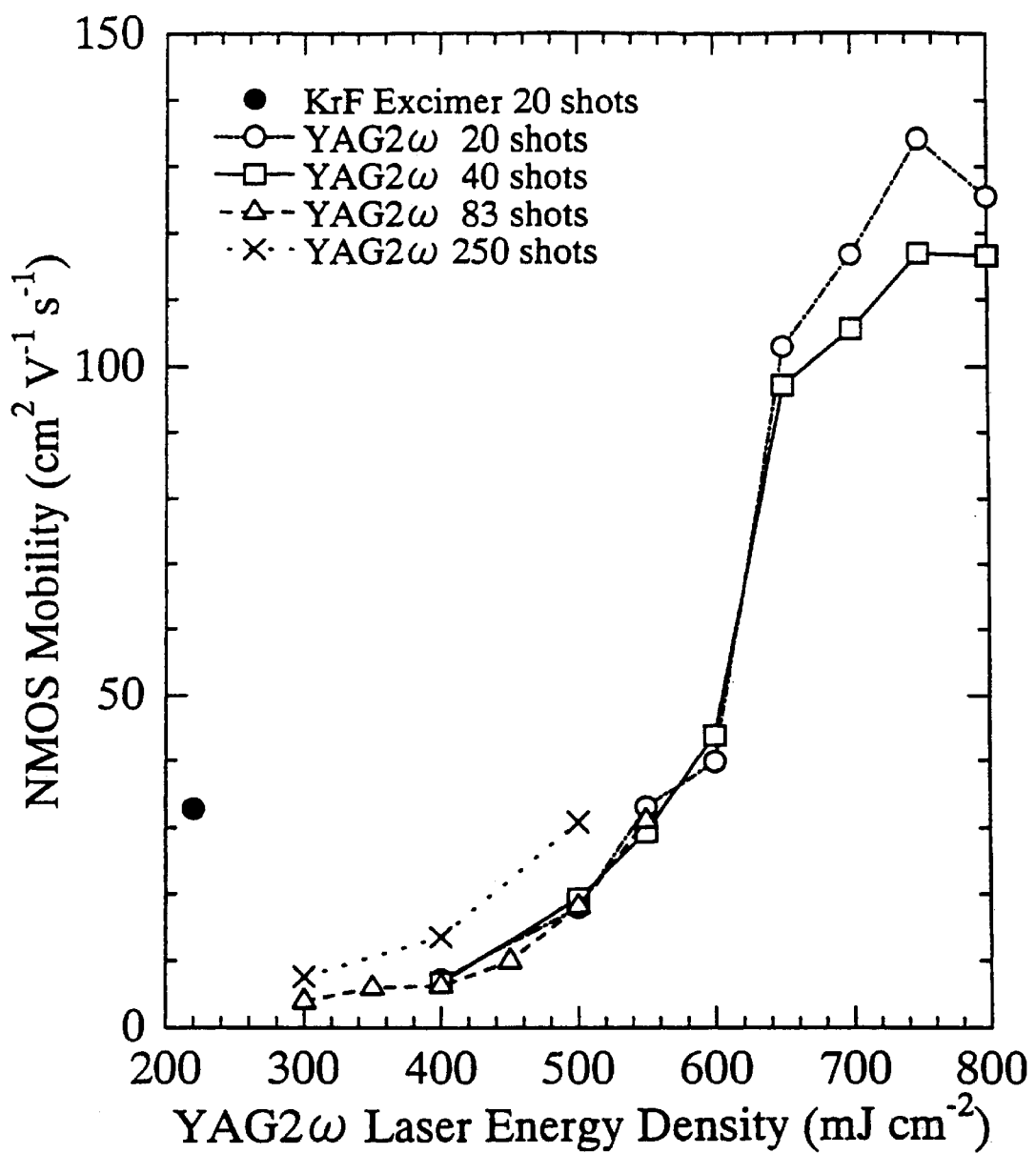
Figure 15:
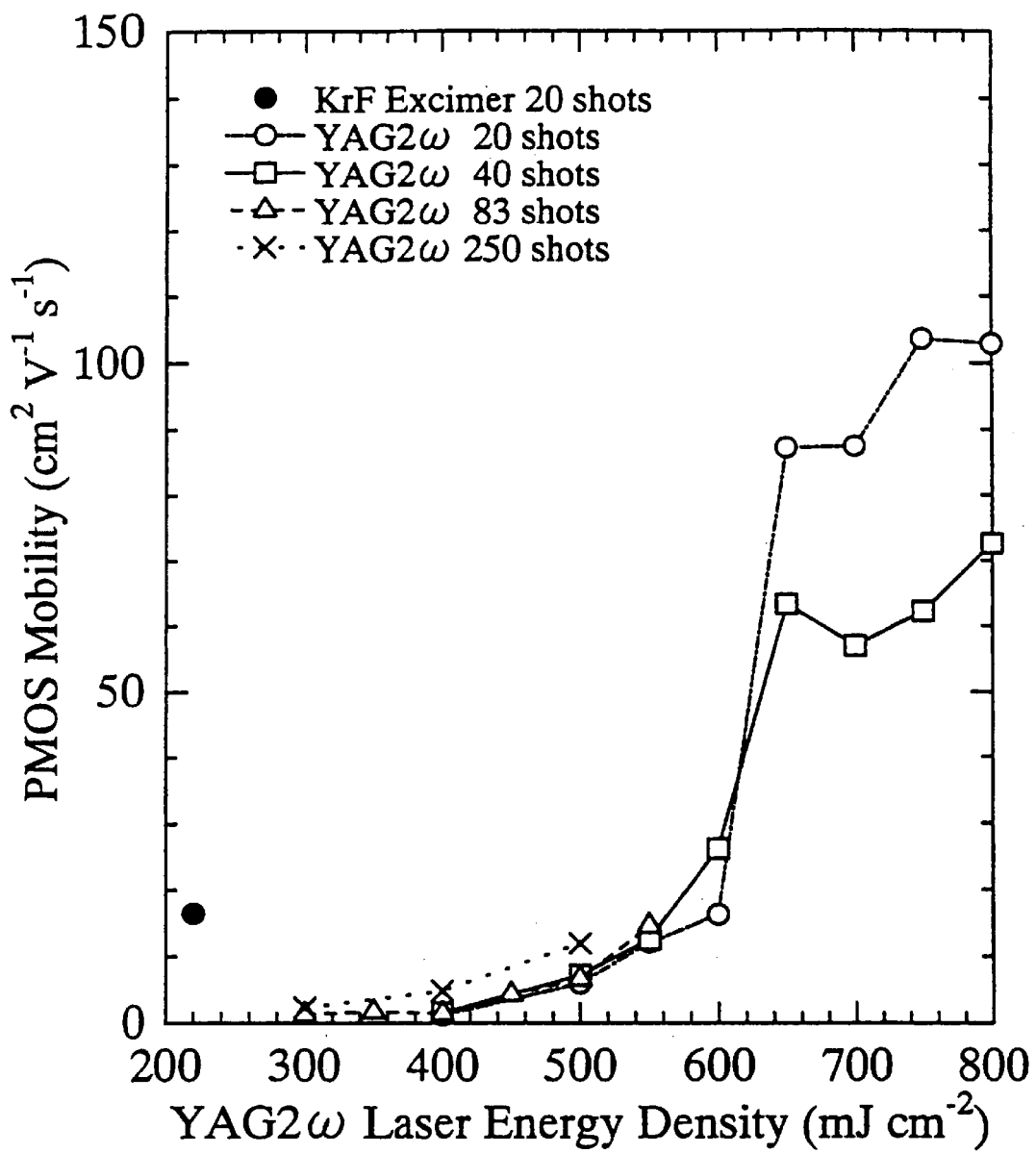

FIGS. 14 and 15 show mobility data for NMOS and PMOS, respectively. By increasing the irradiation energy density above about 650 $mJ \cdot cm^{-2}$, or in other words, melting a volume fraction of 73% or greater along the depth of the semiconductor film, extremely high mobilities can be obtained for both NMOS and PMOS.

As shown in this Example 2, it is possible to easily produce thin film semiconductor devices superior to those produced previously by melting a volume fraction equal to or greater than about 60% along the depth of the semiconductor film. By melting a volume fraction equal to or greater than about 67% along the depth of the semiconductor film, the density of trap states can be reduced dramatically; and by melting a volume fraction equal to or greater than about 73%, excellent results in terms of both low threshold voltage and high mobility can be obtained.

EXAMPLE 3

With the exception of the irradiation of the semiconductor film by the second harmonic of the pulsed Nd:YAG laser in the second processing step, thin film semiconductor devices are produced using exactly the same fabrication process steps as described in Example 1. In this Example 3, the semiconductor film is irradiated by the YAG 2w laser light focused into a line profile in which the width of the beam is 60 mm and has roughly a Gaussian distribution, and the length of the beam is 10 mm. The number of irradiations is 40, and therefore, the amount of translation is 1.5 mm. A pulse frequency of 1334 Hz or greater is desirable from the perspective of mass production. The peak in the energy density gradient along the width of the beam was 16.1 mJ·cm$^{-2}$·mm$^{-1}$. The irradiation laser energy density is 600 mJ·cm$^{-2}$. Other than this, the thin film semiconductor devices were produced under exactly the same conditions used in Example 1. The average mobility determined from the saturation region for N-type thin film semiconductor devices with Vds=8 V was 159 cm$^2$·V$^{-1}$·sec$^{-1}$, and the average mobility determined from the saturation region for P-type thin film semiconductor devices with Vds=−8 V was 70 cm$^2$·V$^{-1}$·sec$^{-1}$. In comparison to the results of Example 1 and FIGS. 14 and 15 from Example 2, for the same irradiation laser energy density, the fact that the amount of translation is smaller and the peak of the energy density gradient is larger are reflected; and it can be seen that even better transistors have been produced.

EXAMPLE 4

With the exception of the irradiation of the semiconductor film by the second harmonic of the pulsed Nd:YAG laser in the second processing step and the thickness of the gate insulator layer, thin film semiconductor devices are produced using exactly the same fabrication process steps as described in Example 1. In this Example 4, the thickness of the gate insulator layer was 60 nm. Additionally, the YAG 2w laser light which irradiates the semiconductor film is focused into a line profile in which the width of the beam is 50 mm with a roughly Gaussian distribution, and the length of the beam is 10 mm. The number of irradiations is 40, and therefore, the amount of translation is 1.25 mm. A pulse frequency of 1600 Hz or greater is desirable from the perspective of mass production. The irradiation laser energy density ranged from 300 mJ·cm$^{-2}$ to 900 mJ·cm$^{-2}$ in intervals of 100 mJ·cm$^{-2}$. Corresponding to this, the peak in the energy density gradient along the width of the beam varies from 11.25 mJ·cm$^{-2}$·mm$^{-1}$ to 33.75 mJ·cm$^{-2}$·mm$^{-1}$. Other than this, the thin film semiconductor devices were produced under exactly the same conditions used in Example 1. Average mobility values obtained at Vds=5 V from the saturation region of N-type thin film semiconductor devices (channel length of 5 mm and channel width of 10 mm) which resulted from the processing described above as well as peak values in the energy density gradient of the YAG 2w laser are presented in FIG. 16.

It can be seen in FIG. 16 that as the laser energy density increases above 600 mJ·cm$^{-2}$, the peak in the energy density gradient also increases above 20 mJ·cm$^{-2}$·mm$^{-1}$ and the mobility rises rapidly to 171 cm$^2$·V$^{-1}$·sec$^{-1}$. It can be seen that as the irradiation energy density increases above $E_{2/3}$= 600 mJ·cm$^{-2}$ at which a volume fraction of two thirds of the semiconductor film melts, the peak in the energy density gradient simultaneously exceeds 20 mJ·cm$^{-2}$·mm$^{-1}$ and the semiconductor properties improve significantly. Further, it can be seen that even when the laser energy density is 900 mJ·cm$^{-2}$ which exceeds the value of complete melting of $E_{CM}$=850 mJ·cm$^{-2}$, a excellent mobility of 188 cm$^2$·V$^{-1}$·sec$^{-1}$ can still be achieved. This is because even if nuclei are randomly generated within the semiconductor film as a result of the complete melting, grain growth can occur in the direction of the width of the irradiation region as a result of the film being irradiated multiple times and eventually by the peak in the energy density gradient which exceeds 30 mJ·cm$^{-2}$·mm$^{-1}$. When exceeding the complete melting condition $E_{CM}$ using excimer laser annealing of the prior art, the transistor properties degrade rapidly. In contrast, in the present invention, superior thin film semiconductor devices can be produced even if the complete melting condition is somewhat exceeded. In other words, this means that the range of conditions under which excellent semiconductor devices can be produced is exceptionally large; and it is possible to reliably achieve superior semiconductor devices. In reality from FIG. 16, high mobility thin film semiconductor devices were produced over a wide range of process conditions spanning 300 mJ·cm$^{-2}$ in laser energy density from 600 mJ·cm$^{-2}$ to 900 mJ·cm$^{-2}$.

As described above, by means of the fabrication procedure for thin film semiconductor devices of the present invention, it is possible to simply and reliably produce high performance thin film semiconductor devices using a low temperature process in which low cost glass substrates can be used. Consequently, when the present invention is applied to the production of active matrix liquid crystal display devices, it is possible to simply and reliably produce high quality liquid crystal display devices on large substrates. Additionally, when applied to the fabrication of other electronic circuits, it is possible to produce high quality electronic circuits both simply and reliably.

What is claimed is:

1. A fabrication process of a thin film semiconductor device comprising a step of irradiating pulsed laser light on a semiconductor film:

wherein said semiconductor film includes amorphous silicon and crystalline silicon, said pulsed laser light has a wavelength of 370–710 nm so that said pulsed laser light is selective absorbed by said amorphous silicon and said amorphous silicon is selectively melted, and an irradiation energy density of said pulsed laser light is distributed in a Gaussian profile in a direction of a width of an essentially rectangular irradiation region of said pulsed laser light irradiated on said semiconductor film so that temperature in said semiconductor film is distributed in said direction of said width of said irradiation region and said melted amorphous silicon is crystallized in said direction of said width of said irradiation region.

2. The fabrication process of a thin film semiconductor device as described in claim 1, a ratio of a length of said irradiation region to said width being 100 or higher.

3. The fabrication process of a thin film semiconductor device as described in claim 1, a ratio of a length of said irradiation region to said width being 1000 or higher.

4. The fabrication process of a thin film semiconductor device as described in claim 1, characterized by a maximum irradiation energy density gradient value of 3 mJ·cm$^{-2}$·m$^{-1}$ or higher in a direction of said width of said pulsed laser light.

5. The fabrication process of a thin film semiconductor device as described in claim 1, said irradiation region having translation in a lateral direction with each laser shot.

6. The fabrication process of a thin film semiconductor device as described in claim 1, a given location on the semiconductor film being covered by approximately between 10 and 80 pulsed laser light irradiations.

7. A fabrication process of a thin film semiconductor device having a crystalline semiconductor film formed on a substrate, said semiconductor film being an active layer of a transistor and being mainly composed of silicon, the process comprising:

an underlevel protection layer formation step of forming a silicon oxide film as an underlevel protection layer on the substrate;

a first processing step of forming a semiconductor film, which includes amorphous silicon and crystalline silicon, on the underlevel protection layer; and a second processing step of irradiating a second harmonic frequency light of a pulsed neodymium-doped yttrium-aluminum-garnet laser light on the semiconductor film so that said pulsed laser light is selectively absorbed by said amorphous silicon and said amorphous silicon is selectively melted, wherein an irradiation density of said second harmonic frequency light of a pulsed Nd:YAG laser light is distributed in a Gaussian profile in a direction of a width of an essentially rectangular irradiation region of said second harmonic frequency light of a pulsed Nd:YAG laser light on said semiconductor film so that temperature in said semiconductor film is distributed in said direction of said width of said irradiation region and said melted amorphous silicon is crystallized in said direction of said width of said irradiation region.

8. The fabrication process of a thin film semiconductor device as described in claim 7, a ratio of said length to said width being 100 or higher.

9. The fabrication process of a thin film semiconductor device as described in claim 7, a ratio of said length to said width being 1000 or higher.

10. The fabrication process of a thin film semiconductor device as described in claim 7, characterized by a maximum irradiation energy density gradient value of $3 \text{ mJ} \cdot \text{cm}^{-2} \cdot \mu\text{m}^{-1}$ or higher in a direction of said width of said second harmonic frequency of a pulsed Nd:YAG laser light.

11. The fabrication process of a thin film semiconductor device as described in claim 7, said irradiation region having translation in a lateral direction with each laser shot.

12. The fabrication process of a thin film semiconductor device as described in claim 7, a given location on the semiconductor film being covered by approximately between 10 and 80 pulsed laser light irradiations from the second harmonic frequency of an neodymium-doped yttrium-aluminum-garnet laser light.

13. A fabrication process of a thin film semiconductor device having a crystalline semiconductor film formed on a substrate, said semiconductor film being an active layer of a transistor and being mainly composed of silicon (Si), the process comprising:

an underlevel protection layer formation step of forming a silicon oxide film as an underlevel protection layer on the substrate;

a first processing step of forming a semiconductor film, which includes amorphous silicon and crystalline silicon, on the underlevel protection layer; and a second processing step of irradiating a pulsed laser light on the semiconductor film, so that said pulsed laser light is selectively absorbed by said amorphous silicon and said amorphous silicon is selectively melted;

wherein an absorption coefficient of said pulsed laser light in polycrystalline silicon $\mu_{pSi}$ is 0.001 nm-1 or greater and 0.01 nm$^{-1}$ or less, and an irradiation density of said pulsed laser light is distributed in a Gaussian profile in a direction of a width of an essentially rectangular irradiation region of said pulsed laser light on said semiconductor film so that temperature in said semiconductor film is distributed in said direction of said width of said irradiation region and said melted amorphous silicon is crystallized in said direction of said width of said irradiation region.

14. The fabrication process of a thin film semiconductor device as described in claim 13, said substrate being transparent.

15. The fabrication process of a thin film semiconductor device as described in claim 13, formation of said semiconductor film being through deposition by chemical vapor deposition.

16. The fabrication process of a thin film semiconductor device as described in claim 13, formation of said semiconductor film being through deposition by low pressure chemical vapor deposition.

17. The fabrication process of a thin film semiconductor device as described in claim 13, formation of said semiconductor film being through deposition in a high vacuum low pressure chemical vapor deposition reactor.

18. The fabrication process of a thin film semiconductor device as described in claim 17, said high vacuum low pressure chemical vapor deposition reactor having a base pressure of $5 \times 10^{-7}$ Torr or less immediately prior to deposition of the semiconductor film.

19. The fabrication process of a thin film semiconductor device as described in claim 13, said pulsed laser light being produced by a solid state light emitting element.

20. The fabrication process of a thin film semiconductor device as described in claim 13, in which said pulsed laser light being a second harmonic of a neodymium-doped yttrium-aluminum-garnet laser light.

21. A fabrication process of a thin film semiconductor device having a crystalline semiconductor film formed on a substrate, said semiconductor film being an active layer of a transistor and being mainly composed of silicon (Si), the process comprising:

an underlevel protection layer formation step of forming a silicon oxide film as an underlevel protection layer on the substrate;

a first processing step of forming a semiconductor film, which includes amorphous silicon and crystalline silicon and has a film thickness of d, on the underlevel protection layer; and a second processing step of irradiating a pulsed laser light in which the absorption coefficient of said pulsed laser light in polycrystalline silicon $\mu$pSi is 0.001 nm$^{-1}$ or greater and 0.01 nm1 or less, on the semiconductor film, so that said pulsed laser light is selectively absorbed by said amorphous silicon and said amorphous silicon is selectively melted, wherein said film thickness d and said absorption coefficient $\mu$pSi satisfy the equation:

$$0.105 \cdot \mu_{psi}^{-1} < d < 0.693 \cdot \mu_{pSi}^{-1},$$

and an irradiation density of said pulsed laser light is distributed in a Gaussian profile in a direction of a width of an essentially rectangular irradiation region of said pulsed laser light on said semiconductor film so that temperature in said semiconductor film is distributed in said direction of said width of said irradiation region and said melted amorphous silicon is crystallized in said direction of said width of said irradiation region.

22. The fabrication process of a thin film semiconductor device as described in claim 21, said substrate being transparent.

23. The fabrication process of a thin film semiconductor device as described in claim 21, formation of said semiconductor film being through deposition by chemical vapor deposition.

24. The fabrication process of a thin film semiconductor device as described in claim 21, formation of said semiconductor film being through deposition by low pressure chemical vapor deposition.

25. The fabrication process of a thin film semiconductor device as described in claim 21, formation of said semiconductor film being through deposition in a high vacuum low pressure chemical vapor deposition reactor.

26. The fabrication process of a thin film semiconductor device as described in claim 25, said high vacuum low pressure chemical vapor deposition reactor having a base pressure of $5\times10^{-7}$ Torr or less immediately prior to deposition of the semiconductor film.

27. The fabrication process of a thin film semiconductor device as described in claim 21, said pulsed laser light being produced by a solid state light emitting element.

28. The fabrication process of a thin film semiconductor device as described in claim 21, said pulsed laser light being a second harmonic of a neodymium-doped yttrium-aluminum-garnet laser light.

29. A fabrication process of a thin film semiconductor device having a crystalline semiconductor film formed on a substrate, said semiconductor film being an active layer of a transistor and being mainly composed of silicon (Si), the process comprising:

an underlevel protection layer formation step of forming a silicon oxide film as an underlevel protection layer on the substrate;

a first processing step of forming a semiconductor film, which includes amorphous silicon and crystalline silicon and has a film thickness of d, on the underlevel protection layer; and a second processing step of irradiating a pulsed laser light in which the absorption coefficient of said pulsed laser light in polycrystalline silicon $\mu_{pSi}$ is 0.001 nm$^{-1}$ or greater and 0.01 nm$^{-1}$ or less, on the semiconductor film so that said pulsed laser light is selectively absorbed by said amorphous silicon and said amorphous silicon is selectively melted, wherein said film thickness d and said absorption coefficient $\mu$pSi satisfy the equation:

$$0.405\cdot\mu_{pSi}^{-1}<d<0.693\cdot\mu_{pSi}^{-1},$$

and an irradiation density of said pulsed laser light is distributed in a Gaussian profile in a direction of a width of an essentially rectangular irradiation region of said pulsed laser light on said semiconductor film so that temperature in said semiconductor film is distributed in said direction of said width of said irradiation region and said melted amorphous silicon is crystallized in said direction of said width of said irradiation region.

30. A fabrication process of a thin film semiconductor device having a crystalline semiconductor film formed on a substrate, said semiconductor film being an active layer of a transistor and being mainly composed of silicon, the process comprising:

an underlevel protection layer formation step of forming a silicon oxide film as an underlevel protection layer on the substrate;

a first processing step of forming a semiconductor film, which includes amorphous silicon and crystalline silicon, on the underlevel protection layer such that a thickness of the semiconductor film is 25 nm or greater and 165 nm or less; and a second processing step of irradiating a second harmonic frequency light of a neodymium-doped yttrium-aluminum-garnet laser light so that said laser light is selectively absorbed by said amorphous silicon and said amorphous silicon is selectively melted, wherein an irradiation density of said second harmonic frequency light of an Nd:YAG laser light is distributed in a Gaussian profile in a direction of a width of an essentially rectangular irradiation region of said second harmonic frequency light of a Nd:YAG laser light on said semiconductor film so that temperature in said semiconductor film is distributed in said direction of said width of said irradiation region and said melted amorphous silicon is crystallized in said direction of said width of said irradiation region.

31. The fabrication process of a thin film semiconductor device as described in claim 30, a thickness of said semiconductor film being 25 nm or greater and 95 nm or less.

32. The fabrication process of a thin film semiconductor device as described in claim 30, said substrate being transparent.

33. The fabrication process of a thin film semiconductor device as described in claim 30, formation of said semiconductor film being through deposition by chemical vapor deposition.

34. The fabrication process of a thin film semiconductor device as described in claim 30, formation of said semiconductor film being through deposition by low pressure chemical vapor deposition.

35. The fabrication process of a thin film semiconductor device as described in claim 30, formation of said semiconductor film being through deposition in a high vacuum low pressure chemical vapor deposition reactor.

36. The fabrication process of a thin film semiconductor device as described in claim 35, said high vacuum low pressure chemical vapor deposition reactor having a base pressure of $5\times10^{-7}$ Torr or less immediately prior to deposition of the semiconductor film.

* * * * *